US008913165B2

(12) United States Patent
Okigawa

(10) Patent No.: US 8,913,165 B2
(45) Date of Patent: Dec. 16, 2014

(54) COLOR IMAGE PICKUP DEVICE

(71) Applicant: FUJIFILM Corporation, Tokyo (JP)

(72) Inventor: Mitsuru Okigawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/224,506

(22) Filed: Mar. 25, 2014

(65) Prior Publication Data
US 2014/0204249 A1 Jul. 24, 2014

Related U.S. Application Data

(63) Continuation of application No. PCT/JP2012/071599, filed on Aug. 27, 2012.

(30) Foreign Application Priority Data

Sep. 26, 2011 (JP) ................................. 2011-208710

(51) Int. Cl.
| H04N 3/14 | (2006.01) |
|---|---|
| H04N 5/225 | (2006.01) |
| H04N 9/64 | (2006.01) |
| H04N 9/04 | (2006.01) |
| H01L 27/146 | (2006.01) |

(52) U.S. Cl.
CPC .............. *H04N 9/646* (2013.01); *H04N 9/045* (2013.01); *H01L 27/14621* (2013.01); *H01L 27/14685* (2013.01)
USPC .......................................... 348/280; 348/340

(58) Field of Classification Search
CPC ................... H01L 27/14621; H01L 27/14627
USPC ...................... 348/272–280, 218.1, 335, 340; 250/208.1
See application file for complete search history.

(56) References Cited

U.S. PATENT DOCUMENTS 5,251,019 A 10/1993 Moorman et al.
7,642,500 B2 * 1/2010 Lin ............................ 250/208.1
(Continued)

FOREIGN PATENT DOCUMENTS

JP 58-219889 A 12/1983
JP 2000-125310 A 4/2000
(Continued)

OTHER PUBLICATIONS

International Preliminary Report on Patentability for PCT/JP2012/071599 (Forms PCT/IB/326, PCT/IB/373, PCT/ISA/237).
(Continued)

*Primary Examiner* — Twyler Haskins
*Assistant Examiner* — Akshay Trehan
(74) *Attorney, Agent, or Firm* — Birch, Stewart, Kolasch & Birch, LLP

(57) ABSTRACT

A color image pickup device is provided with four pixel groups i.e. first to fourth pixel groups. The first pixel group is composed of nine pixels of 3×3 each having one of color filters, and the pixels are arranged in a Bayer pattern. The second pixel group is adjacent to the bottom of the first pixel group. The third pixel group is adjacent to the right of the second pixel group. The fourth pixel group is adjacent to the top of the third pixel group. The second pixel group, the third pixel group, and the fourth pixel group have such array patterns of the color filters that the array pattern of the first pixel group is turned by 90 degrees, 180 degrees, and 270 degrees counterclockwise, respectively. By using the pixels of 6×6 including the first to fourth pixel groups as a basic unit, an imaging surface is configured.

13 Claims, 19 Drawing Sheets

(56) References Cited

U.S. PATENT DOCUMENTS 8,134,633 B2    3/2012    Watanabe
2009/0128672 A1*    5/2009    Watanabe .................... 348/273

FOREIGN PATENT DOCUMENTS

| | | |
|---|---|---|
| JP | 2006-270364 A | 10/2006 |
| JP | 2009-170562 A | 7/2009 |

OTHER PUBLICATIONS

International Search Report for PCT/JP2012/071599 mailed on Sep. 18, 2012.

Written Opinion of the International Searching Authority for PCT/JP2012/071599 mailed on Sep. 18, 2012.

* cited by examiner

PRIOR ART

COLOR IMAGE PICKUP DEVICE

CROSS REFERENCE TO RELATED APPLICATIONS

This non-provisional application is a Continuation of International Application No. PCT/JP2012/071599filed on Aug. 27, 2012, which claims the benefit of Japanese Application No. 2011-208710 filed in Japan on Sept. 26, 2011. The entire contents of all of the above applications are hereby incorporated by reference.

BACKGROUND OF THE INVENTION

1. Field of the Invention

The present invention relates to a single plate type color image pickup device.

2. Description Related to the Prior Art

A single plate type color image pickup device is known in which red, green, and blue color filters are disposed on a plurality of pixels according to a predetermined pattern (refer to U.S. Pat. No. 8,134,633 corresponding to Japanese Patent Laid-Open Publication No. 2009-088255). In the single plate type color image pickup device, a signal of an arbitrary color pixel is subjected to an arithmetic process. The signal of the pixel is complemented with color information of the remaining two colors of pixels in the vicinity of thereof. Therefore, it is possible to obtain a full color image in which each pixel has three colors of signals.

In the color image pickup device according to the U.S. Pat. No. 8,134,633, square pixels are arranged in a lattice. The color filters are provided on the pixels in a Bayer pattern.

In the Bayer pattern, as shown at the top left of FIG. 19, out of four pixels arranged in a square lattice of 2×2, green color filters 200G are assigned to the two diagonal pixels, and a red color filter 200R and a blue color filter 200B are assigned to the remaining two pixels on a one-by-one basis, to compose a basic unit 202 of an array pattern. By sequentially arranging the basic units 202 in accordance with the position of the pixels, an imaging surface is formed in the square lattice for suitable use in the color image pickup device. Note that, in drawings of this application, "R" represents the red color filter. "G" represents the green color filter. "B" represents the blue color filter.

In the color image pickup device according to the U.S. Pat. No. 8,134,633, each pixel is provided with a microlens. Furthermore, the diameter of the microlens provided on the red color filter is increased with increase in a distance from a middle of the imaging surface to a periphery. This is for the sake of preventing a color shading phenomenon caused by a infrared cut filter used together with the color image pickup device. The infrared cut filter, which uses a multilayer interference thin film, shifts a transmission wavelength band to a short wavelength side in regard to oblique incident light having a large incident angle. Thus, a cut wavelength band of the oblique incident light extends to a red region of the visible light range, and hence a red signal is decreased. This phenomenon tends to occur in the periphery of the imaging surface having the large incident angle. As a result, an image becomes bluish relatively in the periphery of the imaging surface. This causes deterioration in image quality of the color image pickup device.

Accordingly, as described in the U.S. Pat. No. 8,134,633, the diameter of the microlenses of the pixels having the red color filters is increased in the periphery of the imaging surface, in order to increase an incident light amount and enhance a relative pixel sensitivity. Precluding decrease in the red signal due to the infrared cut filter offers a good balance among the signals of each color, and prevents the occurrence of the color shading phenomenon caused by the infrared cut filter. The color image pickup device of the U.S. Pat. No. 8,134,633 improves the image quality in this manner.

As shown in FIG. 19, in the Bayer pattern, there is no blue color filter 200B in a line 204 in which the green color filters 200G and the red color filters 200R are vertically aligned in an alternate manner, and in a line 205 in which the green color filters 200G and the red color filters 200R are horizontally aligned in an alternate manner. Likewise, there is no red color filter 200R in a line 206 in which the green color filters 200G and the blue color filters 200B are vertically aligned in an alternate manner, and in a line 207 in which the green color filters 200G and the blue color filters 200B are horizontally aligned in an alternate manner.

There is no red color filter 200R and no blue color filter 200B in a line 208 in which only the green color filters 200G are diagonally aligned. There is no green color filter 200G in a line 209 in which the red color filters 200R and the blue color filters 200B are diagonally aligned in an alternate manner.

In the Bayer pattern, as described above, each of the lines 204 to 209 of the pixels has a nonexistent color. For this reason, the Bayer pattern has a problem that pseudo color that is a wrong color not existing in actual fact tends to be produced in a part having a high spatial frequency of an object and a boundary part of colors. This problem is caused by an array pattern of the color filters provided on the pixels, and therefore cannot be solved by making an adjustment to the diameter of the microlenses and the like.

To prevent the occurrence of the pseudo color, each of the vertical, horizontal, and diagonal lines of the pixels has to include the color filters of every color. However, unless the array pattern of the color filters has regularity, the arithmetic process of the color information becomes complicated and requires much time to produce an image. Therefore, in the color image pickup device, another array pattern of the color filters is desired that can prevent the occurrence of the pseudo color, as compared with the Bayer pattern, without complicating the arithmetic process.

SUMMARY OF THE INVENTION

An object of the present invention is to provide a color image pickup device having an array pattern of the color filters that can prevent the occurrence of the pseudo color, as compared with the Bayer pattern, and does not complicate the arithmetic process.

A color image pickup device according to the present invention has a plurality of four types of pixel groups, that is, first to fourth pixel groups. Each of the first to fourth pixel groups has an array of an array of pixels of N×N (taking N as an integer of 3 or more), and each pixel is provided with one of a red color filter, a green color filter, and a blue color filter. The first to fourth pixel groups are arranged in the same imaging surface such that the second pixel group is adjacent to the bottom of the first pixel group, and the third pixel group is adjacent to the right of the second pixel group, and the fourth pixel group is adjacent to the top of the third pixel group. The second to fourth pixel groups have such array patterns of the color filters that an array pattern of the first pixel group is turned by 90 degrees, 180 degrees, and 270 degrees in one direction, respectively. A ratio in number among the red, green, and blue color filters on a color-by-color basis is different between a pixel area of 2N×2N composed of the first to fourth pixel groups adjoining one another and another pixel area of 2N×2N in a Bayer pattern. The pixel having the color filter whose ratio in number is lower than the ratio in number in the Bayer pattern is set more sensitive than the pixel having the color filter whose ratio in number is higher than the ratio in number in the Bayer pattern.

Each pixel preferably includes a photoelectric conversion element and a microlens. The photoelectric conversion element converts incident light into electric charge and accumulates the electric charge. The microlens is formed in a convex curved shape on a light incidence surface side, and gathers the light to the photoelectric conversion element. The microlens is substantially in shape of a square with rounded four corners in a plane, and is of size within an arrangement pitch of the pixels. The pixel having the color filter whose ratio in number is low preferably has the microlens having the corners having a shorter radius of curvature than a radius of curvature of the corners of the microlens that the pixel having the color filter whose ratio in number is high has. This allows increasing the sensitivity of the pixel that is provided with the color filter whose ratio in number is low.

The microlens may be formed substantially in shape of a circle whose diameter is within an arrangement pitch of the pixels in a plane. In this case, the pixel having the color filter whose ratio in number is low has the microlens having the larger diameter than the diameter of the microlens that the pixel having the color filter whose ratio in number is high has. The microlens having the shape as described above can be formed by melting a photoresist formed in a prismatic or cylindrical shape by heat treatment.

The microlens may be formed substantially in shape of a circle in a plane viewed from the light incidence surface side. In enlarging a diameter of the microlens of the pixel having the color filter whose ratio in number is low, the diameter may be made larger than the arrangement pitch of the pixels. In this case, the microlens is in such a shape as to be partly cut out along a border between the pixels. Such a microlens can be formed by using a gradation mask having a gradient of optical density in a pattern in accordance with the shape of each microlens.

Note that, the microlens of the pixel having the color filter whose ratio in number is high may be formed substantially in shape of a circle in a plane, and the microlens of the pixel having the color filter whose ratio in number is low may be substantially in shape of a square with four rounded corners. In this case, the square microlens is larger than the circular microlens in size, and the sensitivity of the pixel having the square microlens becomes high. Also, as for openings formed in a light shielding film to transmit the incident light, the opening of the pixel having the color filter whose ratio in number is low may be made large, in order to increase the sensitivity of the pixel.

Provided that N≥2M (taking M as an integer of 2 or more), the array of the pixels of N×N is preferably divided into four small groups each having an array of the pixels of M×M. An array pattern of the red, green, and blue color filters of the pixels of M×M is preferably turned by every 90 degrees in one direction in the four small groups, just as with the patterns of the first to fourth pixel groups. Also each of the pixels may be formed in shape of a rhombus into which a square is turned by substantially 45 degrees with respect to a horizontal direction and a vertical direction of the substantially rectangular imaging surface, and the pixels may be arranged in a diagonal direction of 45 degrees.

Provided that N is "3" and the pixel area of 2N×2N (="36") includes the eight red color filters, the twenty green color filters, and the eight blue color filters, a ratio in number between the red color filters and the green color filters is preferably "2.5", and a ratio in number between the blue color filters and the green color filters is preferably "2.5".

Provided that N is "5" and the pixel area of 2N×2N (="100") includes the twenty-four red color filters, the fifty-two green color filters, and the twenty-four blue color filters, a ratio in number between the red color filters and the green color filters is preferably "2.17", and a ratio in number between the blue color filters and the green color filters is preferably "2.17".

According to the present invention, the imaging surface is composed of the first to fourth pixel groups. In the first pixel group, the red, green, and blue color filters are arranged in the predetermined pattern. In the second pixel group, which is adjacent to the bottom of the first pixel group, the color filters are arranged in such a pattern that the array pattern of the first pixel group is turned by 90 degrees in one direction. In the third pixel group, which is adjacent to the right of the second pixel group, the color filters are arranged in such a pattern that the array pattern of the first pixel group is turned by 180 degrees in the same direction. In the fourth pixel group, which is adjacent to the top of the third pixel group and the right of the first pixel group, the color filters are arranged in such a pattern that the array pattern of the first pixel group is turned by 270 degrees in the same direction. Thus, each of vertical, horizontal, and diagonal lines of the entire pixel area includes the color filters of every color, and hence it is possible to prevent the occurrence of pseudo color. Also, the present invention does not cause complication of an arithmetic process owing to regularity in the array pattern of the color filters.

BRIEF DESCRIPTION OF DRAWINGS

For more complete understanding of the present invention, and the advantage thereof, reference is now made to the subsequent descriptions taken in conjunction with the accompanying drawings, in which.

DESCRIPTION OF THE PREFERRED EMBODIMENTS

First Embodiment

Figure 1:
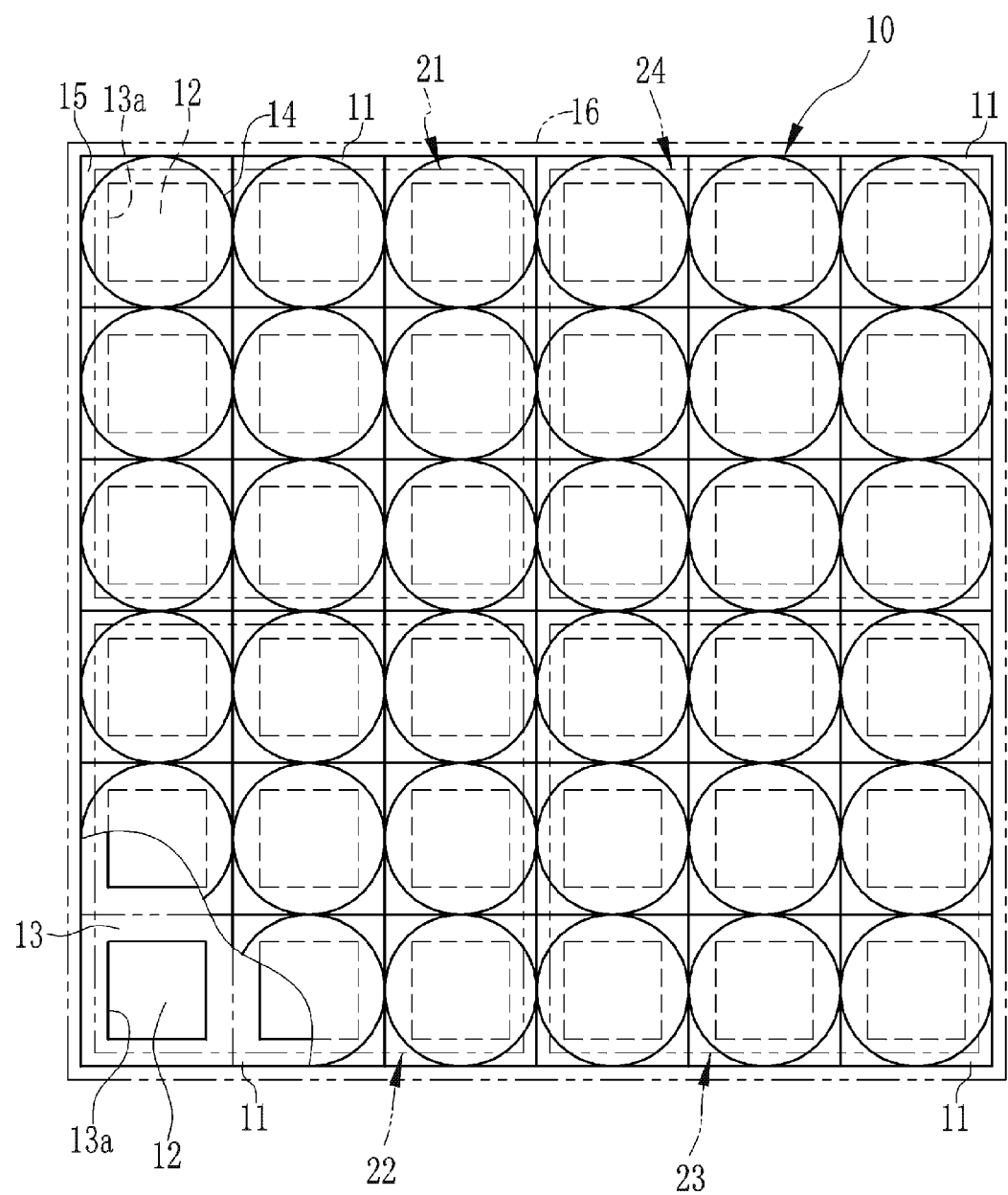
FIG. 1 is an explanatory view showing the structure of an imaging surface of a color image pickup device.

In FIG. 1, a color image pickup device 10 is provided with a plurality of pixels 11 each of which is formed approximately in the shape of a square, as drawn with solid lines. The pixels 11 are arranged in a lattice and compose an approximately square imaging surface 16 to image an object. The color image pickup device 10 e.g. a CCD image sensor, a CMOS image sensor, or the like has a well-known structure that has a square lattice array of the pixels 11. The color image pickup device 10 may be made of an organic film.

Each pixel 11 has a photodiode (hereinafter abbreviated as PD) 12, light shielding film 13, a microlens 14, and a color filter 15. The PD 12 is a photoelectric conversion element that converts incident light into electric charge and accumulates the electric charge. The light shielding film 13 is provided on the PD 12. The light shielding film 13 is formed with openings 13a. The incident light passed through the microlens 14 reaches the PD 12 through the opening 13a. The light shielding film 13 prevents the light from entering an area other than the PD 12.

The microlens 14 is in a partly spherical shape convex to the side of a light incidence surface, and gathers the light into the PD 12. Note that, the microlens may be aspherical, instead of partly spherical, in its light incident surface. The color filter 15 disposed between the PD 12 and the microlens 14 transmits light of a specific wavelength band, out of the light gathered by the microlens 14 to the PD 12.

Figure 2:
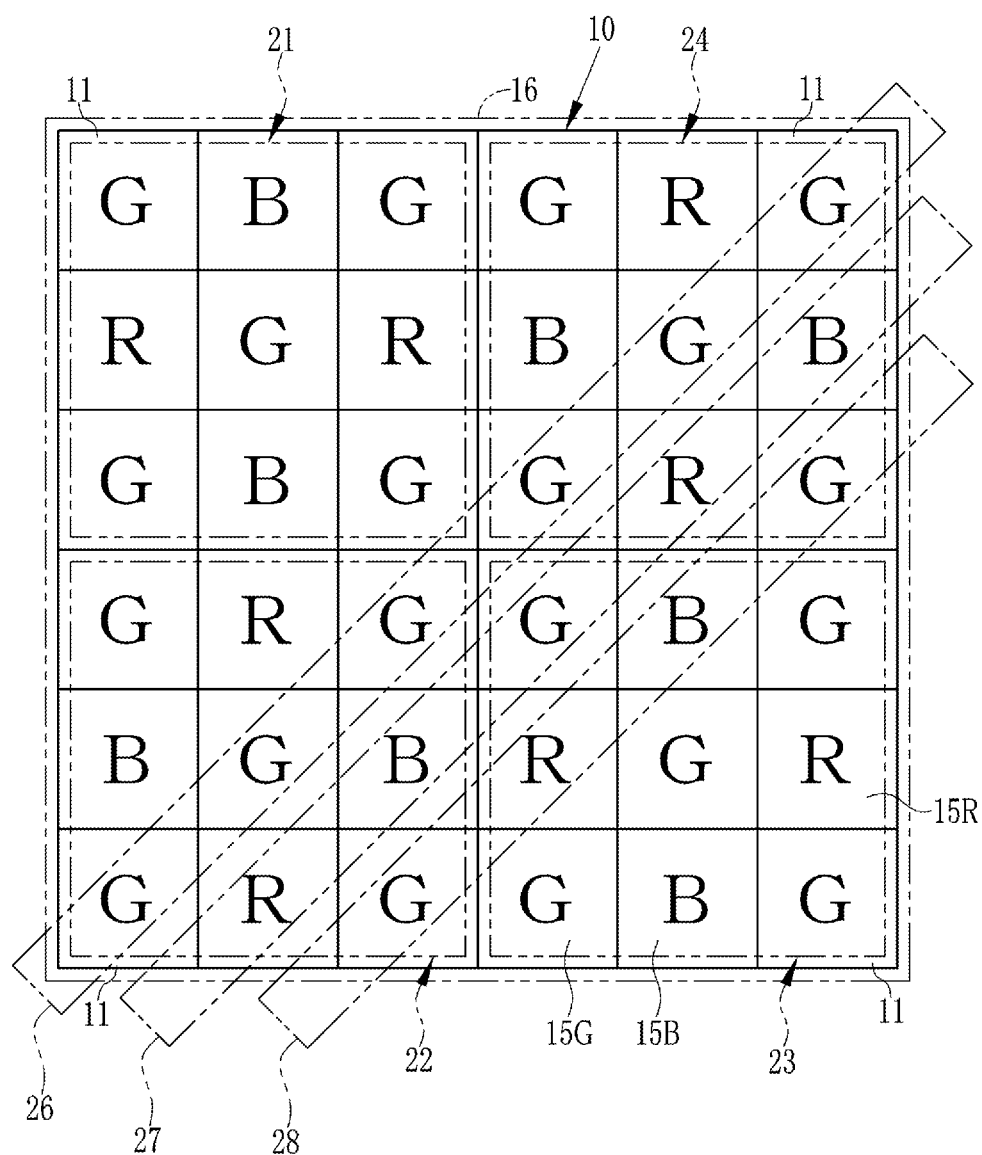
FIG. 2 is an explanatory view of an array pattern of color filters.

As shown in FIG. 2, the color filter 15 includes red color filters 15R for transmitting red light, green color filters 15G for transmitting green light, and blue color filters 15B for transmitting blue light.

Every pixel 11 has one of the red color filter 15R, the green color filter 15G, and the blue color filter 15B. The red, green, and blue color filters 15R, 15G, and 15B are arranged in a predetermined pattern in the imaging surface 16. The pixels 11 are divided into four groups, that is, a first pixel group 21, a second pixel group 22, a third pixel group 23, and a fourth pixel group 24 in accordance with the array pattern of the color filters 15R, 15G, and 15B.

The first pixel group 21 is composed of the nine pixels 11 of 3×3. In the first pixel group 21, the color filters 15R, 15G, and 15B are arranged in a Bayer pattern. The first pixel group 21 has the pixel 11 with the green color filter 15G at its center.

The second pixel group 22 is composed of the nine pixels 11 of 3×3, just as with the first pixel group 21. The second pixel group 22 is adjacent to the bottom of the first pixel group 21 in the imaging surface 16. The "bottom" of the first pixel group 21 denotes an orientation along a plane of the imaging surface 16 in a plan view of the imaging surface 16 viewed from the light incidence surface side. Note that, the other drawings are also represented in this orientation, except for FIGS. 9B and 10.

Figure 3:
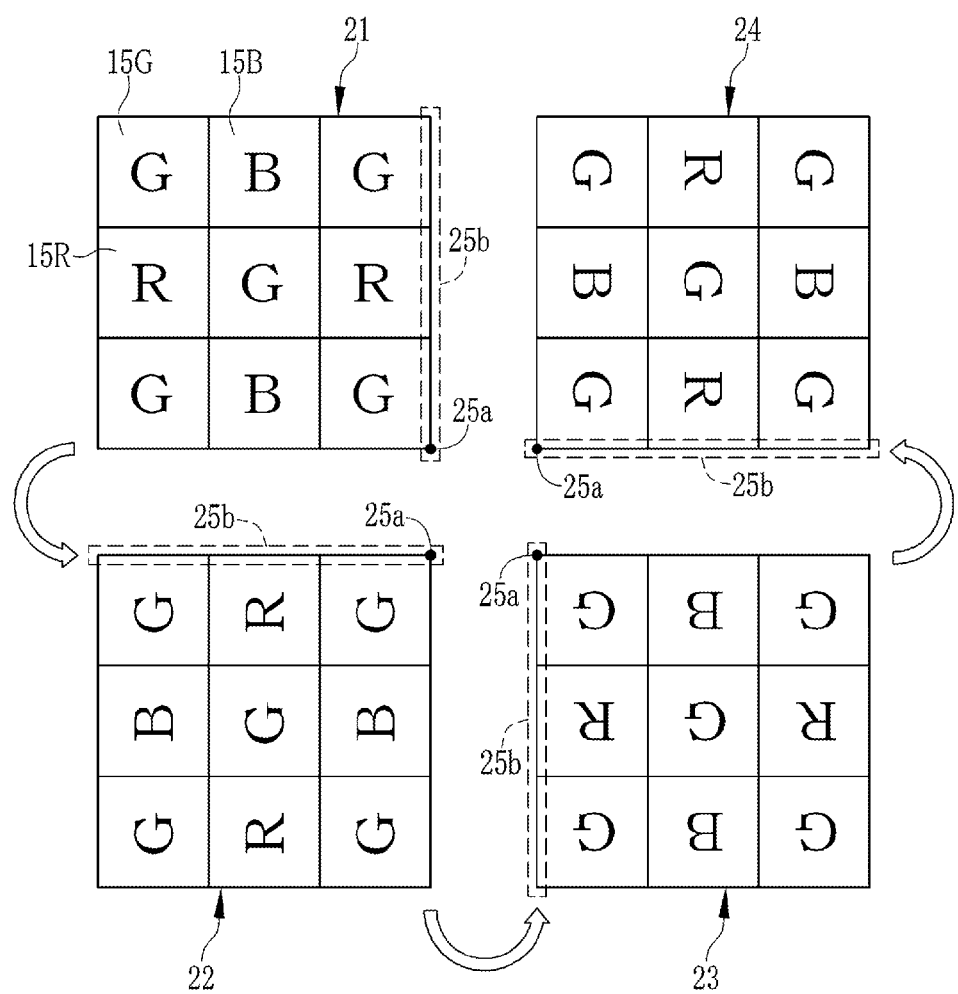
FIG. 3 is an explanatory view showing a concept of the array pattern of the color filters of each pixel group.

As shown in FIGS. 2 and 3, the color filters 15R, 15G, and 15B are arranged in the second pixel group 22 in such a pattern that the array pattern of the first pixel group 21 is turned by 90 degrees counterclockwise. In FIG. 3, letters "R", "G", and "B" representing the filter colors are turned together for the sake of easily understanding that the array pattern of the color filters 15 of the second pixel group 22 corresponds with that the array of the color filters 15 of the first pixel group 21 is turned.

The third pixel group 23 is composed of the nine pixels 11 of 3×3, and is adjacent to the right of the second pixel group 22 in the imaging surface 16. The color filters 15R, 15G, and 15B are arranged in the third pixel group 23 in such a pattern that the array pattern of the first pixel group 21 is turned by 180 degrees counterclockwise.

The fourth pixel group 24 is composed of the nine pixels 11 of 3×3, and is adjacent to the top of the third pixel group 23 in the imaging surface 16. The color filters 15R, 15G, and 15B are arranged in the fourth pixel group 24 in such a pattern that the array pattern of the first pixel group 21 is turned by 270 degrees counterclockwise.

As described above, in the color image pickup device 10, the array pattern being the Bayer pattern of the first pixel group 21 is turned by every 90 degrees to compose the second pixel group 22, the third pixel group 23, and the fourth pixel group 24. Arranging the first to fourth pixel groups 21 to 24 configures the imaging surface 16.

The array pattern of the red, green, and blue color filters 15R, 15G, and 15B of the imaging surface 16, as described above, is based on the Bayer pattern of the first pixel group 21 composed of the nine pixels of 3×3. By turning the Bayer pattern counterclockwise by 90 degrees, 180 degrees, and 270 degrees with respect to the bottom right corner 25a, the array patterns of the second pixel group 22, the third pixel group 23, and the fourth pixel group 24 are obtained, respectively. Then, the first to fourth pixel groups 21 to 24 are combined such that the center of the turn coincides at the bottom right corner 25a of the first pixel group 21 without overlap among the first to fourth pixel groups 21 to 24.

It is also said that the array pattern of the red, green, and blue color filters 15R, 15G, and 15B of the imaging surface 16 is based on the Bayer pattern of the first pixel group 21 composed of the nine pixels of 3×3. By turning the Bayer pattern counterclockwise by 90 degrees, 180 degrees, and 270 degrees such that a line segment 25b being the right side of the first pixel group 21 is moved to the top side, the left side, and the bottom side, the array patterns of the second pixel group 22, the third pixel group 23, and the fourth pixel group 24 are obtained, respectively. Then, the first to fourth pixel groups 21 to 24 are combined such that the line segment 25b of the second pixel group 22, which is moved to the top side, coincides with the bottom side of the first pixel group 21, and the line segment 25b of the third pixel group 23, which is moved to the left side, coincides with the right side of the second pixel group 22, and the line segment 25b of the fourth pixel group 24, which is moved to the bottom side, coincides with the top side of the third pixel group 23.

Note that, each drawing shows the imaging surface 16 composed of the thirty-six pixels 11 of 6×6, being a combination of the one first pixel group 21, the one second pixel group 22, the one third pixel group 23, and the one fourth pixel group 24. However, in actual fact, the imaging surface 16 is composed of a repetition of arrangement of a basic unit, composed of the thirty-six pixels 11 arranged in a lattice, and often has a total pixel number of five millions or more.

Figure 19:
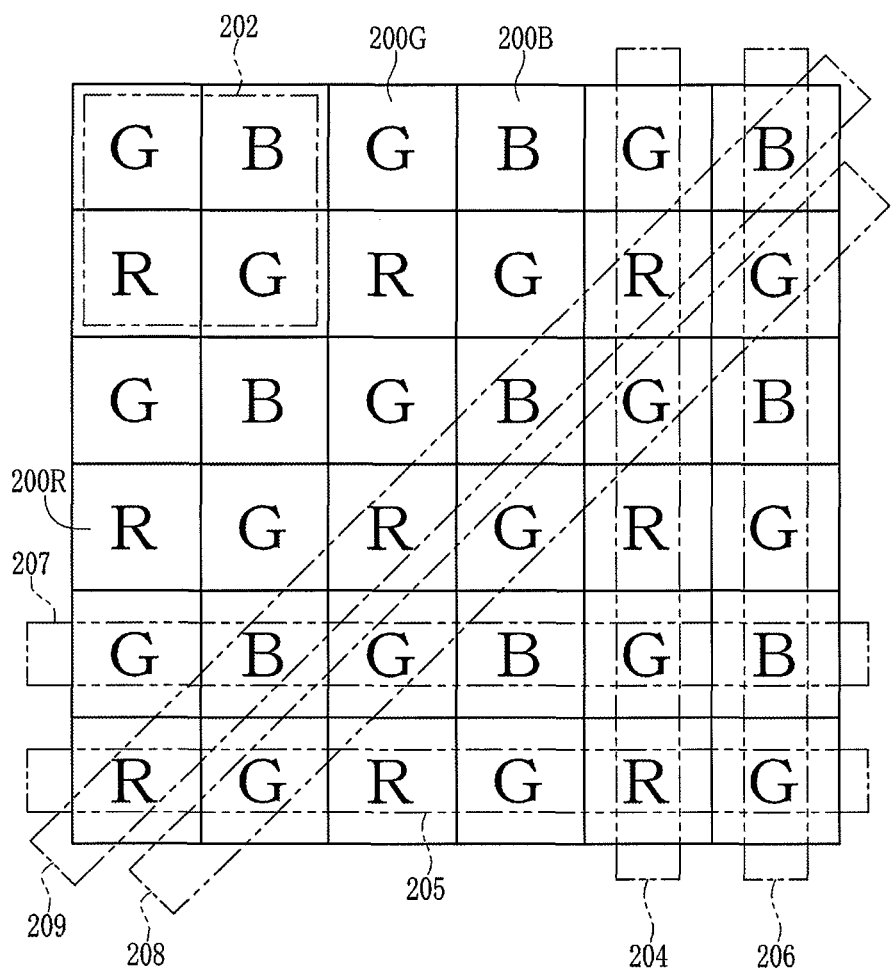
FIG. 19 is an explanatory view of a conventional Bayer pattern.

As shown in FIG. 19, in the Bayer pattern, there is no blue color filter 200B in lines 204 and 205 in which green color filters 200G and red color filters 200R are aligned alternately. There is no red color filter 200R in lines 206 and 207 in which green color filters 200G and blue color filters 200B are aligned alternately.

Therefore, as shown in the following Table 1 at a row of "Bayer pattern", in the vertical and horizontal lines 204 to 207 in the Bayer pattern, every line includes the pixels having the green color filter 200G, but on the contrary no line has both of the red color filter 200R and the blue color filter 200B. Thus, the ratio of the vertical and horizontal lines having the pixel with the green color filter 200G is 100%. The ratio of the vertical and horizontal lines having the pixel with the red color filter 200R and the pixel with the blue color filter 200B is 0%, because of no existence of such a line.

TABLE 1

| Name of array | Basic unit | Ratio of lines including green pixels | | Ratio of lines including both red pixels and blue pixels | | Pixel number | | | Ratio of green pixels | |
|---|---|---|---|---|---|---|---|---|---|---|
| | | Vertical and horizontal directions | Diagonal direction | Vertical and horizontal directions | Diagonal direction | R | G | B | G/R | G/B |
| Array of color image pickup device 10 | 6 × 6 | 100% | 100% | 100% | 67% | 8 | 20 | 8 | 2.5 | 2.5 |
| Bayer pattern | 2 × 2 | 100% | 50% | 0% | 50% | 1 | 2 | 1 | 2.0 | 2.0 |

On the other hand, as shown in FIG. 2, in an area of 6×6 being the basic unit of the color image pickup device 10, every line out of vertical six lines and horizontal six lines includes the pixel 11 (hereinafter called green pixel) having the green color filter 15G, the pixel 11 (hereinafter called red pixel) having the red color filter 15R, and the pixel (hereinafter called blue pixel) having the blue color filter 15B. Accordingly, as shown in Table 1, in the lines of the color image pickup device extending in the vertical and horizontal directions (up-to-down and side-to-side directions), the ratio of the lines having the green pixel is 100%, and the ratio of the lines having both of the red pixel and the blue pixel is 100%.

In the Bayer pattern, two types of lines, that is, lines 208 having only the green color filters 200G and lines 209 having the alternately aligned red color filters 200R and blue color filters 200B are alternately arranged in a diagonal direction. Thus, as for the diagonal lines of the Bayer pattern, the ratio of the lines having the green pixel is 50%, and the ratio of the lines having both of the red pixel and the blue pixel is 50%.

In the color image pickup device 10, On the other hand, a line 26 having only the green pixels and two lines 27 and 28 each having the red pixels, the green pixels, and the blue pixels aligned by turns are arranged in the diagonal direction in the imaging surface 16. Accordingly, as shown in Table 1, as for the diagonal lines of the color image pickup device 10, the ratio of the lines having the green pixel is 100%, and the ratio of the lines having both of the red pixel and the blue pixel is 67%. Note that, the diagonal lines 26 to 28 rise from the bottom left to the top right, but other diagonal lines that are symmetrical to the diagonal lines 26 to 28 and fall from the top left to the bottom right have the same structure.

As described above, according to the array pattern of the color image pickup device 10, each of the vertical, horizontal, and diagonal lines of the imaging surface 16 includes the color filters 15R, 15G, and 15B of every color at a higher ratio than that in the Bayer pattern. Therefore, the color image pickup device 10 can more appropriately obtain color information of every line in an arithmetic process, as compared with the case of the Bayer pattern, and prevents the occurrence of pseudo color. In the color image pickup device 10, the imaging surface 16 is configured by arranging the basic units, each including the pixels of 6×6, in a lattice. Since periodicity of the array pattern is maintained in accordance with the basic unit, the arithmetic process is not complicated.

In the above embodiment, the first pixel group 21 situated at the top left of the basic unit is in the Bayer pattern, and the first pixel group 21 is turned counterclockwise by every 90 degrees to compose the other pixel groups. However, one of the other pixel groups 22 to 24 may be in the Bayer pattern, and this pixel group may be turned by every 90 degrees counterclockwise or clockwise.

Second Embodiment

As shown in Table 1, the Bayer pattern includes one red pixel, two green pixels, and one blue pixel in a basic unit of 2×2. Thus, the ratio G/R of the green pixel (G) relative to the red pixel (R) is 2.0. The ratio G/B of the green pixel (G) relative to the blue pixel (B) is 2.0.

On the other hand, the array pattern of the color image pickup device 10 includes eight red pixels, twenty green pixels, and eight blue pixels in a basic unit of 6×6. Thus, the ratio G/R is 2.5. The ratio G/B is 2.5. If the basic unit of 6×6 is in the Bayer pattern, the basic unit includes nine red pixels, eighteen green pixels, and nine blue pixels. Therefore, the array pattern of the color image pickup device 10 includes more number of green pixels and less number of red pixels and blue pixels than the Bayer pattern has. Note that, since the number of pixels included in one side of each of the pixel groups 21 to 24 is "3", the basic unit of 6×6 corresponds to 2N×2N, in substituting "3" into N described in claims.

As described above, the color image pickup device 10 has a lower ratio of the red pixels relative to the green pixels and a lower ratio of the blue pixels relative to the green pixels than the Bayer pattern has. Therefore, in order to obtain the same white balance between the color image pickup device 10 and the Bayer pattern, the color image pickup device 10 has to have an increased amplification factor of the red pixels and the blue pixels.

However, if the amplification factor of the red pixels and the blue pixels is increased, color noise (pseudo color) is increased therewith and hence impairs the effect of preventing the pseudo color caused by the array pattern. More specifically, the effect of preventing the pseudo color is decreased by the order of −2 dB as an S/N ratio, as shown in the following mathematical expression 1.

$$20\log_{10}(2/2.5) = 20(\log_{10}4/5) \quad \text{Mathematicla Expression 1}$$
$$= 20(\log_{10}(2^2/(10/2)))$$
$$= -1.938 dB$$

Figure 4:
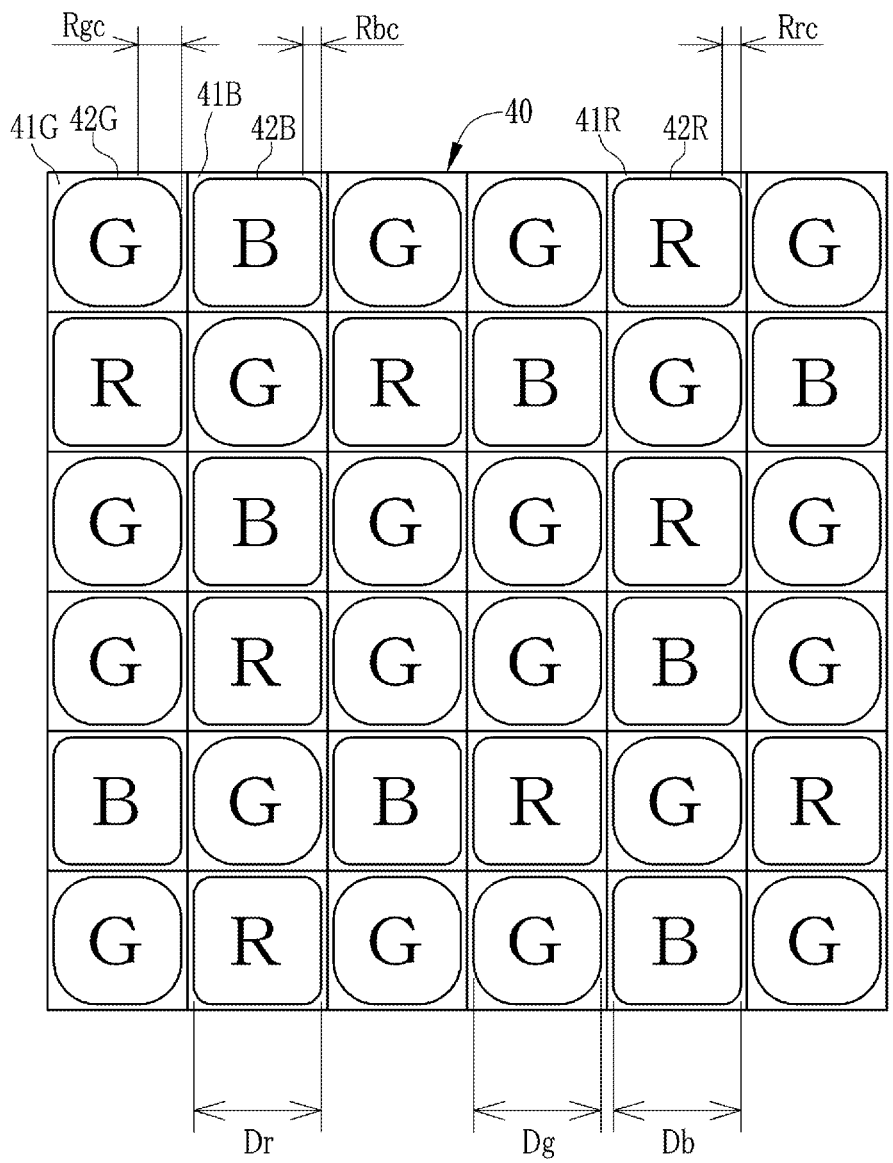
FIG. 4 is an explanatory view of microlenses provided on individual pixels.

Accordingly, as shown in a color image pickup device 40 of FIG. 4, a plane projection area of a microlens 42R of a red pixel 41R and a microlens 42B of a blue pixel 41B may be formed larger than a plane projection area of a microlens 42G of a green pixel 41G. Note that, since the color image pickup device 40 has the same structure as the color image pickup device 10 of the above embodiment except for the shapes of the microlenses 42R, 42G, and 42B, the detailed description thereof will be omitted.

Each of the microlenses 42R, 42G, and 42B has a light incidence surface formed in a convex curved shape, and is formed in the shape of a square with rounded four corners in a plane. The lengths Dr, Dg, and Db of one side of the microlenses 42R, 42G, and 42B are approximately the same. The radius Rrc of curvature of the corner of the microlens 42R is approximately the same as the radius Rbc of curvature of the corner of the microlens 42B. The radiuses Rrc and Rbc of curvature are shorter than the radius Rgc of curvature of the corner of the microlens 42G.

In the color image pickup device 40, as described above, the corners of the microlens 42G are formed rounder than the corners of the microlenses 42R and 42B, so that the plane projection area (size shown in a plane) of the microlenses 42R and 42B is larger than the plane projection area of the microlens 42G. Thus, the light gathering effect of the microlenses 42R and 42B becomes higher than that of the microlens 42G, and hence the sensitivity of the red pixel 41R and the blue pixel 41B becomes higher than that of the green pixel 41G. The higher the sensitivity of the red pixel 41R and the blue pixel 41B relative to the sensitivity of the green pixel 41G, the less the amplification factor of the red pixel and the blue pixel is increased to obtain the same white balance as that in the Bayer pattern. This results in keeping the color noise within a low level.

Figure 5:
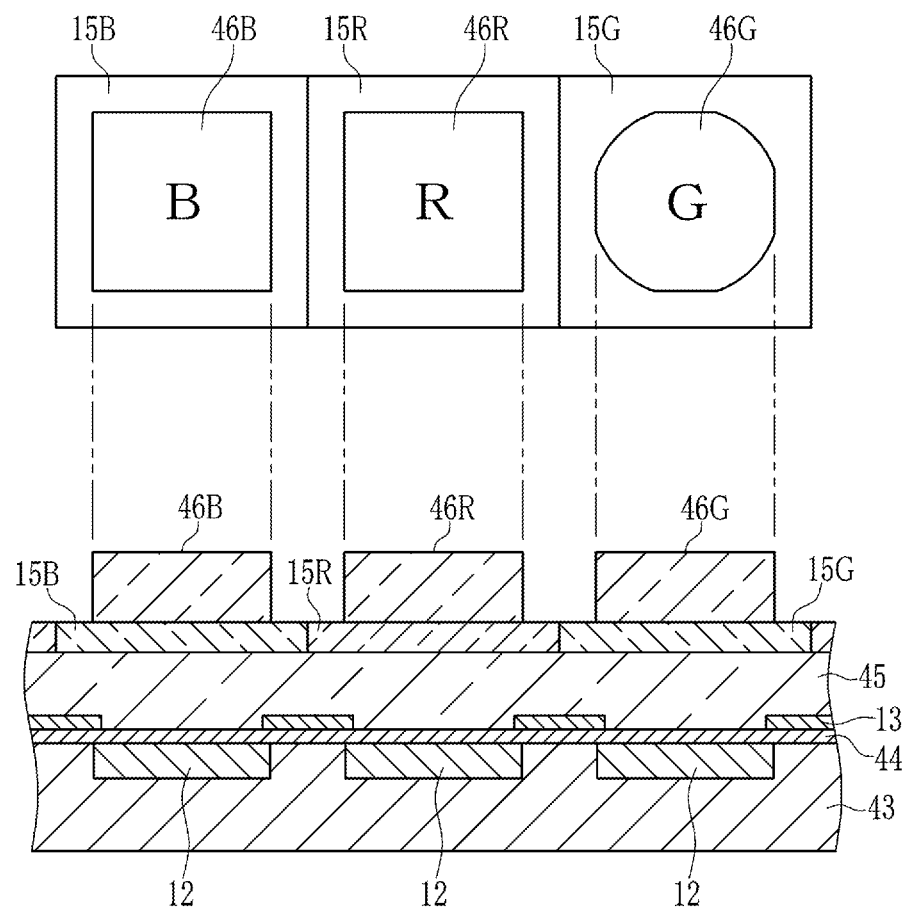
FIG. 5 is an explanatory view in a state of forming prismatic and cylindrical photoresists.

To form the microlenses 42R, 42G, and 42B, as shown in FIG. 5, an insulating film 44 that contains at least a silicon oxide film layer, the light shielding film 13, and a flattening film 45 are firstly formed on a semiconducting substrate 43 formed with the PDs 12. Then, the color filters 15R, 15G, and 15B are formed on the flattening film 45 according to the array pattern shown in FIG. 2. The insulating film 44 is a transparent film that prevents contact between the light shielding film 13, which is often made of metal, and the semiconducting substrate 43. The insulating film 44 also protects a surface of a semiconductor and decreases in an interface state, which causes deterioration in image quality.

The flattening layer 45 is a transparent film that fills projections and depressions in the semiconducting substrate 43 caused by the light shielding film 13 and the like, for the purpose of forming a flat plane on which the color filters 15 are formable. The flattening layer 45 is made of a transparent organic film, for example, formed by spin coating into a flat surface. Note that, this structure is just an example. Agate insulating film, a gate electrode, metal wiring, a light shielding film, and a flattening film may be formed instead in an area of the insulating film 44, the light shielding film 13, and the flattening film 45.

After the color filters 15R, 15G, and 15B are formed, a photoresist film is formed thereon. The photoresist film is subjected to a well-known photolithographic process and etching process. By partitioning the photoresist film into the pixels, photoresists 46R, 46G, and 46B, being a base of the microlenses 42R, 42G, and 42B, is formed.

The photoresist 46R on the red color filter 15R and the photoresist 46B on the blue color filter 15B are formed in an approximately quadrangular prism shape. On the other hand, the photoresist 46G on the green color filter 15G is formed in an approximately cylindrical shape. Difference in a mask pattern, which is formed in a photomask used in a lithography process, embodies this difference in shape among the photoresists 46R, 46B, and 46B.

Figure 6:
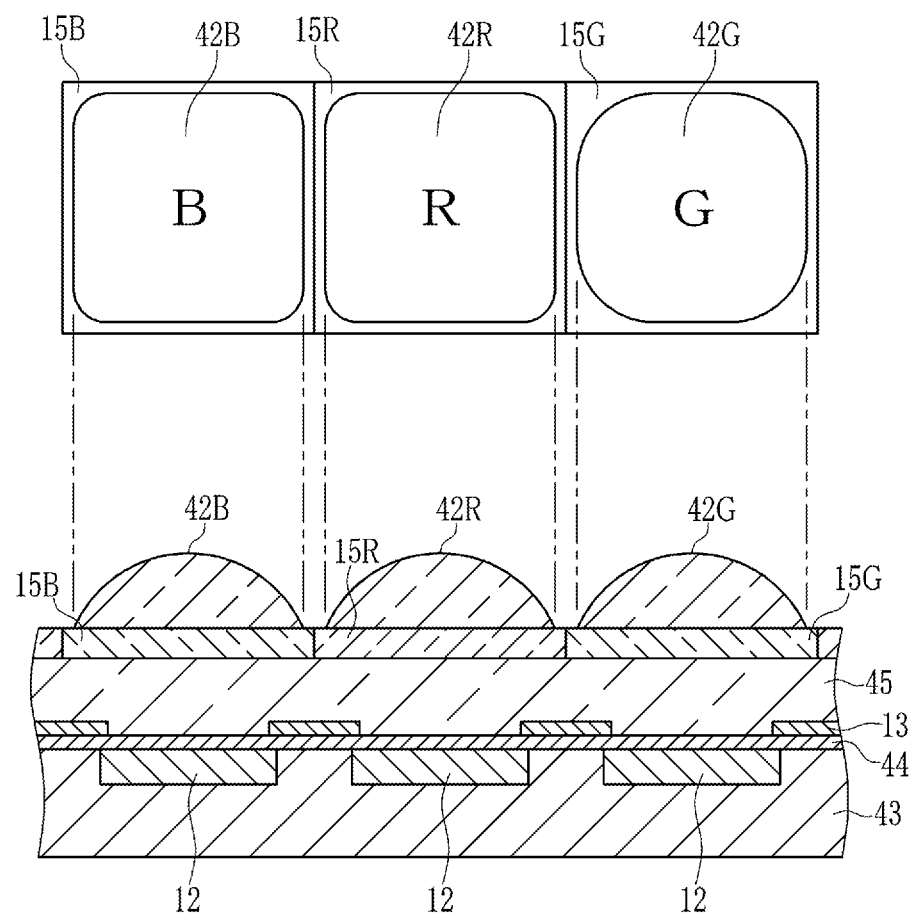
FIG. 6 is an explanatory view in a state of forming the microlenses by melting the photoresists.

Heat treatment is applied to the photoresists 46R, 46G, and 46B. Taking advantage of a phenomenon in which a surface tension deforms the photoresists 46R, 46G, and 46B so as to reduce a surface area, the convex curved shape is formed as shown in FIG. 6.

Accordingly, the microlenses 42R, 42G, and 42B can be formed such that the radiuses Rrc and Rbc of curvature are smaller than the radius Rgc of curvature, and the plane projection area of the microlenses 42R and 42B is larger than the plane projection area of the microlens 42G.

Third Embodiment

Figure 7:
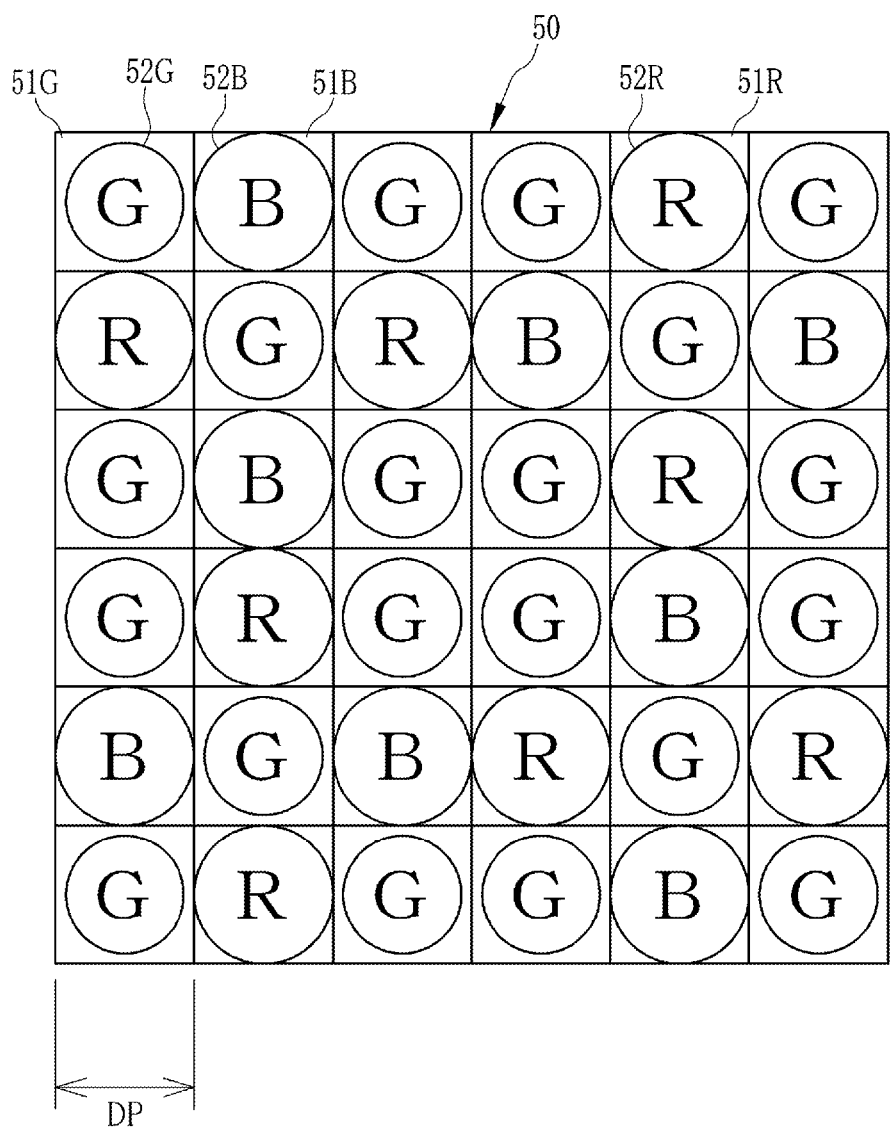
FIG. 7 is an explanatory view of an example in which the diameter of the microlenses are varied.

In the color image pickup device 40, each of the microlenses 42R, 42G, and 42B is formed approximately in the shape of a square. The radiuses Rrc, Rbc, and Rgc of curvature are varied to make the plane projection area of the microlenses 42R and 42B larger than the plane projection area of the microlens 42G. However, as shown in a color image pickup device 50 of FIG. 7, the plane projection area may be varied by varying the diameter of a microlens that is formed approximately in the shape of a circle in a plane.

In the color image pickup device 50, a red pixel 51R is provided with a microlens 52R formed approximately in the shape of a circle. A green pixel 51G is provided with a microlens 52G formed approximately in the shape of a circle. A blue pixel 51B is provided with a microlens 52B formed approximately in the shape of a circle. The microlens 52R of the red pixel 51R and the microlens 52B of the blue pixel 51B have a diameter approximately the same as an arrangement pitch DP of the pixels. On the other hand, the microlens 52G of the green pixel 51G has a diameter slightly smaller than the arrangement pitch DP.

Since the diameter of the microlens 52G is smaller than that of the microlenses 52R and 52B, as described above, the plane projection area of the microlenses 52R and the 52B is made larger than the plane projection area of the microlens 52G, so it is possible to obtain the same effect as the color image pickup device 40 has. Note that, to form the microlenses 52R, 52G, and 52B having diameters of the arrangement pitch DP or less, photoresists formed in the shape of a cylinder may be melted, just as with the microlenses 42R 42G, and 42B of the color image pickup device 40.

Fourth Embodiment

Figure 8:
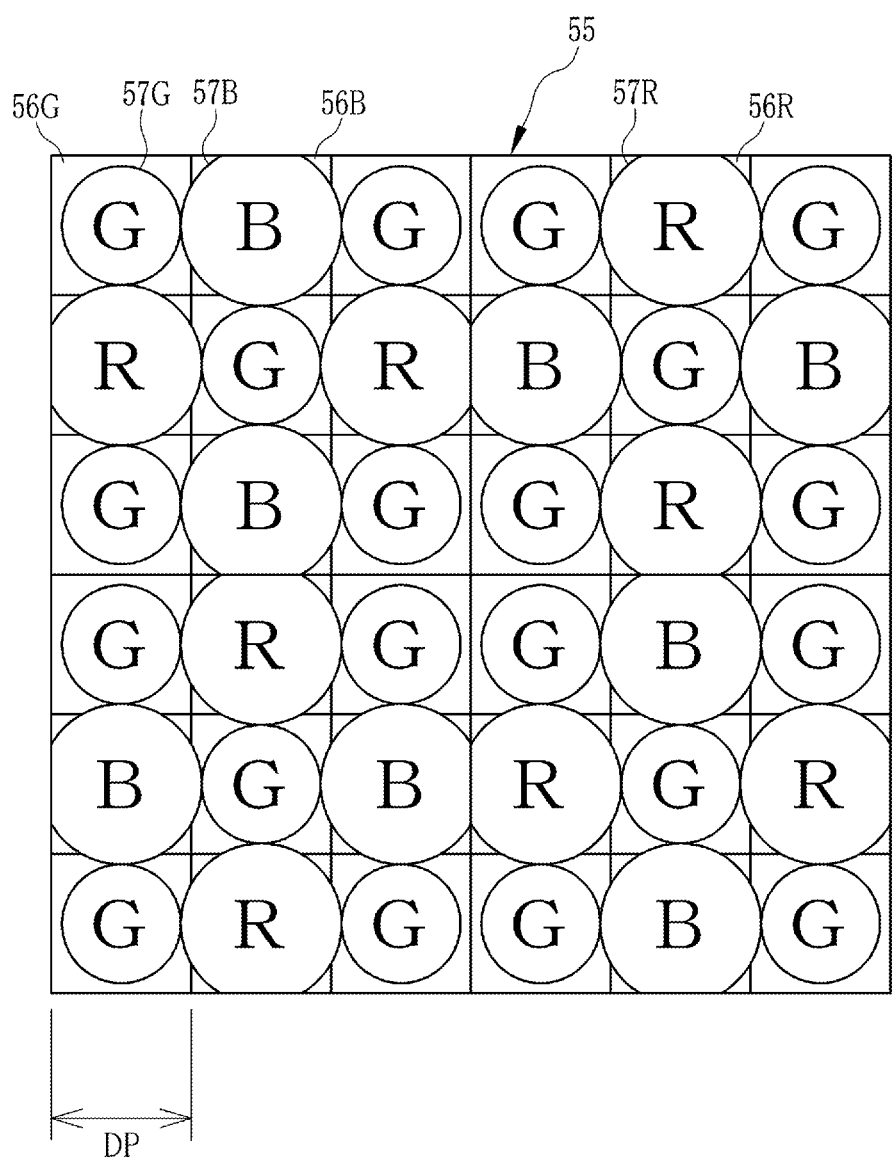
FIG. 8 is an explanatory view of an example in which the diameter of the microlenses of red pixels and blue pixels is larger than an arrangement pitch of the pixels.

In the color image pickup device 50, the diameter of each of the microlenses 52R, 52G, and 52B is the arrangement pitch DP of the pixels or less. However, as shown in a color image pickup device 55 of FIG. 8, the diameter of a microlens 57R of a red pixel 56R and a microlens 57B of a blue pixel 56B may be larger than the arrangement pitch DP.

In the color image pickup device 55, a microlens 57G of a green pixel 56G is formed in the shape of a circle having a diameter that is slightly smaller than the arrangement pitch DP, just as with the microlens 52G of the color image pickup device 50.

The microlenses 57R and 57B are formed in the shape of a circle having a diameter larger than the arrangement pitch DP. A part of each microlens 57R, 57B gets into an area of the green pixel 56G that is opened by making the diameter of the microlens 57G small. The microlenses 57R and 57B make contact with each other at a portion in which the red pixel 56R and the blue pixel 56B are adjacent. Thus, although the microlenses 57R and 57B are approximately in the shape of a circle, the microlenses 57R and 57B are formed in such a shape that a part of each microlens 57R, 57B is cut out along an interface between the red pixel 56R and the blue pixel 56B. The microlenses 57R and 57B are disposed so as to make contact with each other at these cut surfaces.

Making the diameter of the microlenses 57R and 57B larger than the arrangement pitch DP can bring about effective use of the open area of the green pixel 56G, and further increase in the sensitivity of the red pixel 56R and the blue pixel 56B.

If the microlenses 57R and 57B are formed by heat treatment, the microlenses 57R and 57B are integrated at contact portions in melting the photoresists. The heat treatment is unsuitable for forming the microlenses 57R and 57B precisely.

Figure 9A:
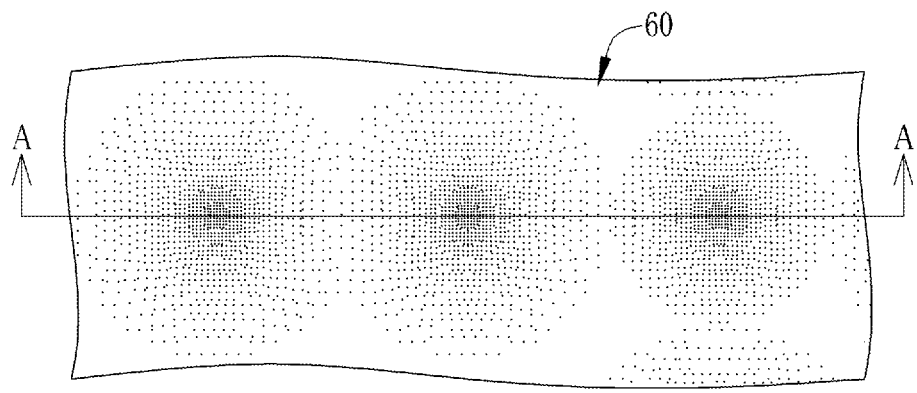
FIG. 9A is an explanatory view of a gradation mask.

Therefore, a gradation mask 60, as shown in FIG. 9A, is used in forming the microlenses 57R, 57G, and 57B. The gradation mask 60 has the gradient of optical density to allow adjustment of a light transmission amount in accordance with the shape of the microlenses 57R, 57G, and 57B.

Figure 9B:
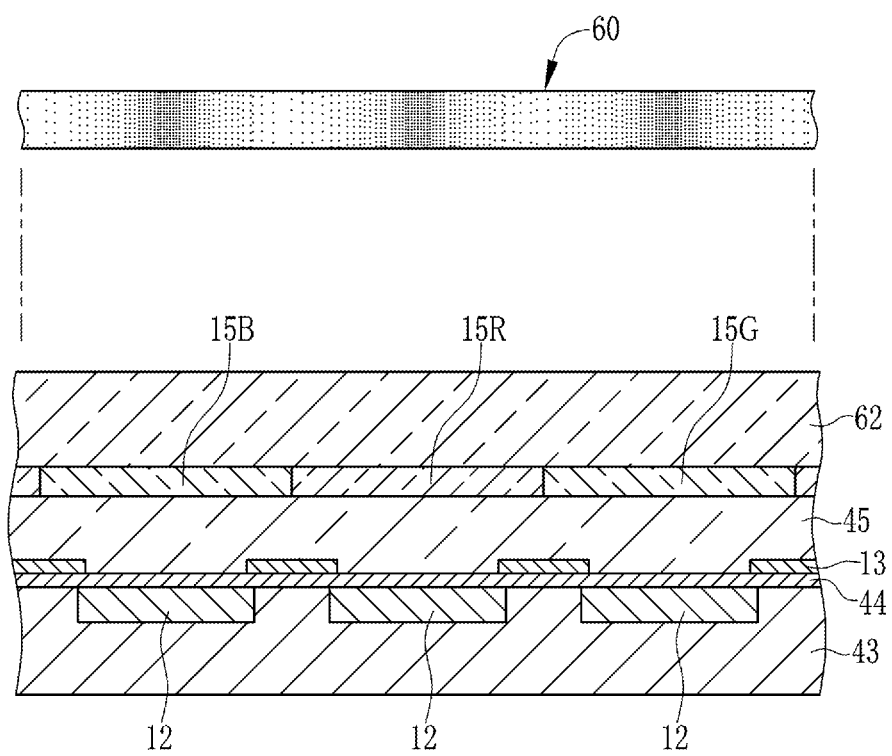
FIG. 9B is a cross sectional view taken along a line A-A in FIG. 9A.

For example, in the case of using a positive type photoresist, which melts at an exposed part, as shown in FIG. 9A, a concentric pattern is formed on a microlens-by-microlens basis. In this concentric pattern, the optical density is the highest at a part corresponding to the center of the microlens to reduce the light transmission amount, and the optical density is gradually decreased outwardly to increase the light transmission amount. FIG. 9A is a plan view of a part of the gradation mask 60. FIG. 9B is a sectional view of the gradation mask 60 cut along a line A-A (sectional view cut along a straight line passing through the center of the gradient of the optical density).

Figure 10:
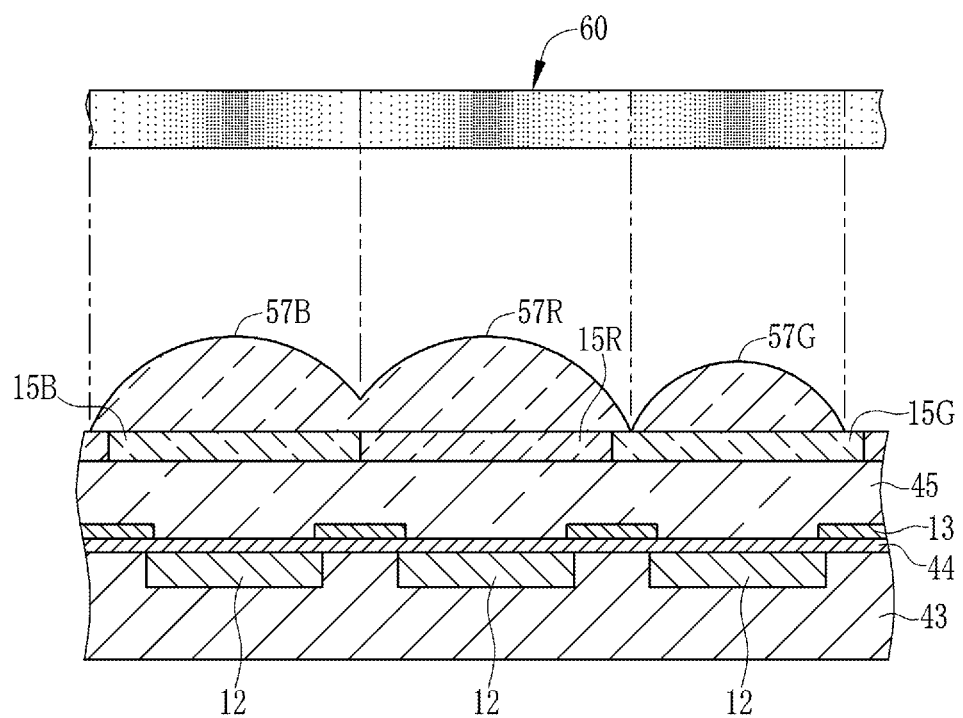
FIG. 10 is an explanatory view in the state of being formed with microlenses.

In the case of using the gradation mask 60, just as with the case of the heat treatment, the insulating film 44 that contains at least the silicon oxide film layer, the light shielding film 13, and the flattening film 45 are firstly formed on the semiconducting substrate 43 formed with the PDs 12, and then a photoresist film 62 is formed thereon. After that, the gradation mask 60 is set to make an exposure. The photoresist film 62 is exposed through the gradation mask 60. Then, an exposed part of the photoresist film 62 is melted and removed to obtain the microlenses 57R, 57G, and 57B, as shown in FIG. 10.

As described above, the use of the gradation mask 10 makes it possible to appropriately form the microlenses 57R and 57B, in such a shape that each microlens 57R, 57B is in the shape of a partial sphere a part of which is cut out along a border line between adjacent pixels and the cut surfaces of the microlenses 57R and 57B make contact with each other.

Fifth Embodiment

Figure 11:
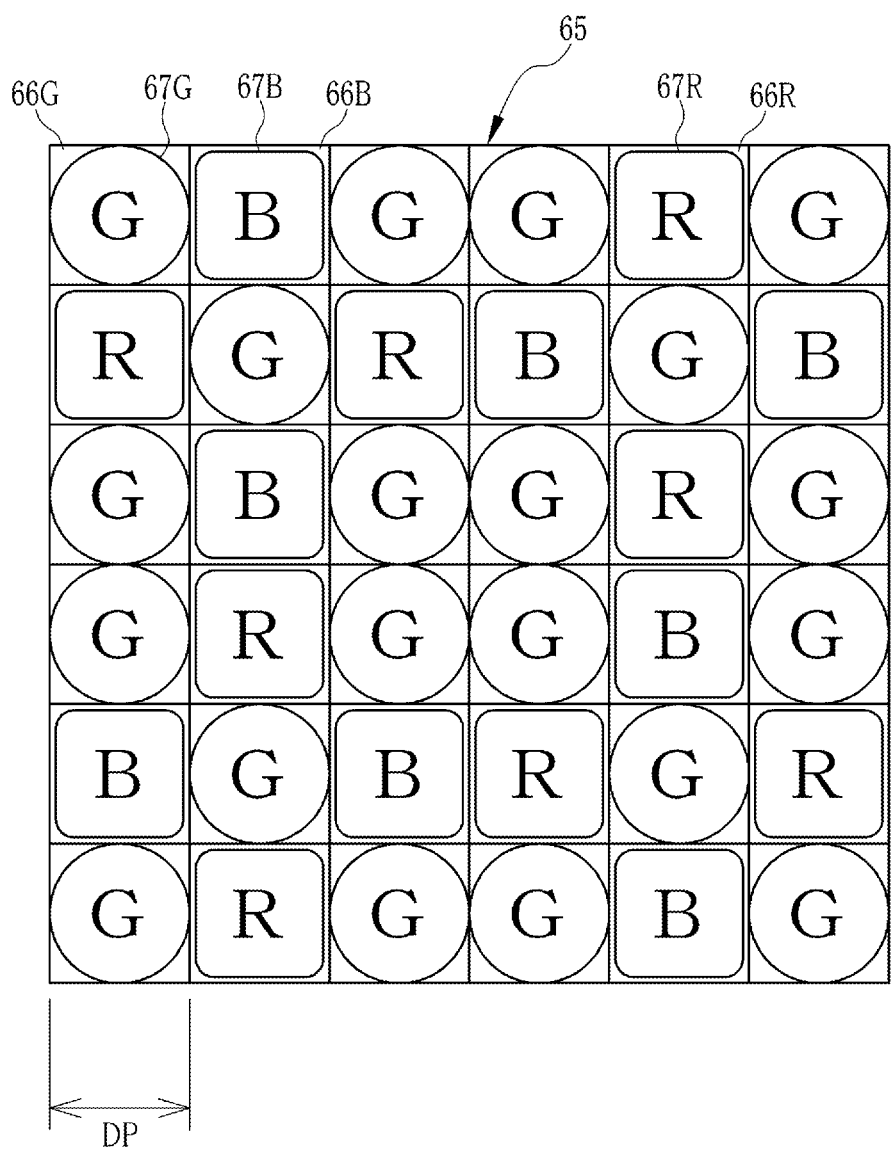
FIG. 11 is an explanatory view of an example in which the green pixels have circular microlenses and the red pixels and the blue pixels have approximately square microlenses.

According to the color image pickup device 40, the microlenses each of which has the convex curved light incidence surface and is approximately in the shape of a square in a plane are formed in a pixel-by-pixel basis. According to the color image pickup devices 50 and 55, the microlenses each of which is approximately in the shape of a circle in a plane are formed on a pixel-by-pixel basis. As shown in a color image pickup device 65 of FIG. 11, the shape of the microlenses may be different from color to color. In FIG. 11, each of microlenses 67G, 67R, and 67B has a light incident surface in the shape of a convex partial sphere. On the other hand, viewed in a plane, the microlens 67G of a green pixel 66G is formed approximately in the shape of a circle, and the microlens 67R of a red pixel 66R and the microlens 67B of a blue pixel 66B are formed approximately in the shape of a square.

The diameter of the microlens 67G and the length of a side of the microlens 67R, 67B are equal to or less than the arrangement pitch DP of the pixels, and approximately equal to each other. Accordingly, the light gathering effect of the microlenses 67R and 67B becomes higher than that of the microlens 67G, and hence the sensitivity of the red pixel 66R and the blue pixel 66B becomes higher than that of the green pixel 66G, just as with the structure of the color image pickup device 40 and the like.

Note that, the length of the side of the microlens 67R, 67B is slightly shorter than the arrangement pitch DP in FIG. 11. This is for the sake of preventing the microlenses from overlapping one another. However, in the case of adopting a manufacturing process using the gradation mask, the length of the microlens 67R, 67B may be equal to the arrangement pitch DP, just as with the diameter of the microlens 67G. Furthermore, the length of the microlens 67R, 67B may be longer than the arrangement pitch DP to increase the sensitivity.

Sixth Embodiment

Figure 12:
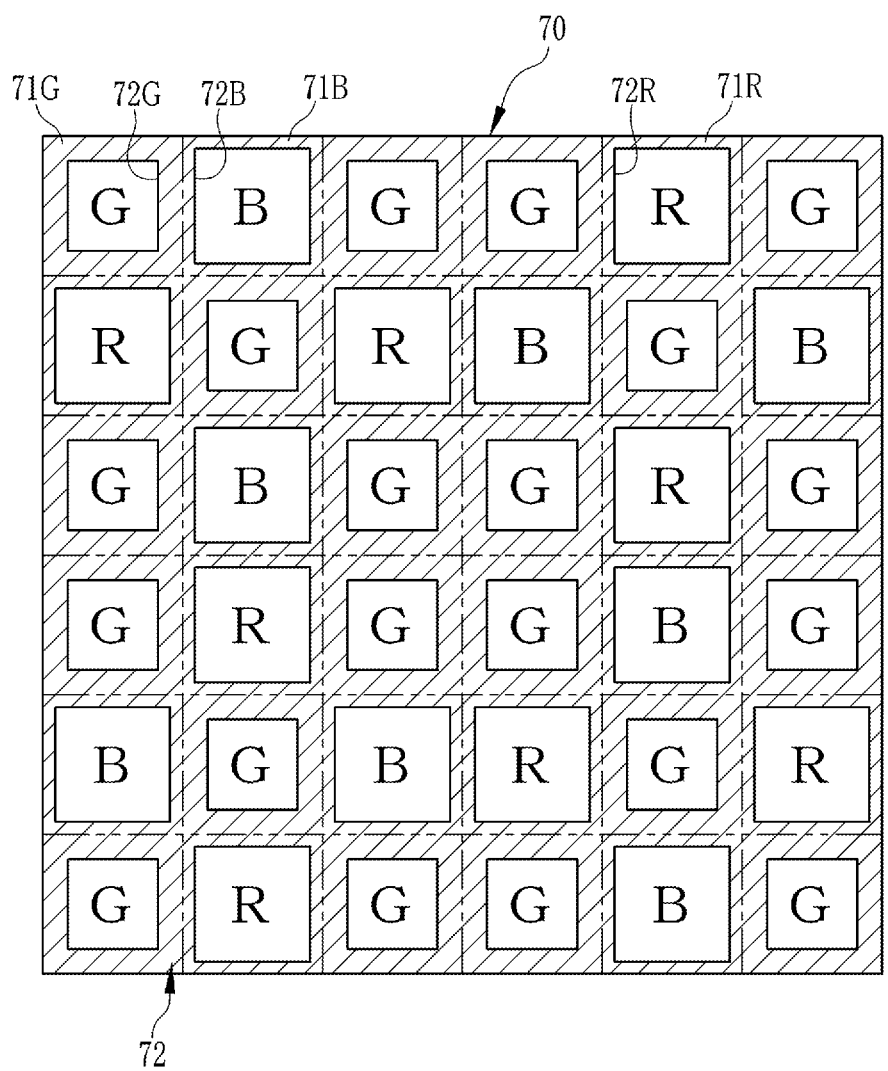
FIG. 12 is an explanatory view of an example in which openings of a light shielding film have varying sizes.

In a color image pickup device 70 shown in FIG. 12, the size of an opening 72R of a light shielding film 72 (hatched in the drawing) of a red pixel 71R and the size of an opening 72B of the light shielding film 72 of a blue pixel 71B are larger than the size of an opening 72G of the light shielding film 72 of a green pixel 71G.

Varying the size of the openings in the light shielding film 72, as described above, makes the sensitivity of the red pixel 71R and the blue pixel 71B higher than the sensitivity of the green pixel 71G. This embodiment brings about the same effect as the above embodiments in which the shape of the microlenses is varied to adjust the sensitivity among the red, green, and blue pixels. Note that, not only one of the shape of the microlenses and the size of the openings in the light shielding film, but both of the shape of the microlenses and the size of the openings may be varied to adjust the sensitivity among the red, green, and blue pixels.

Seventh Embodiment

Figure 13:
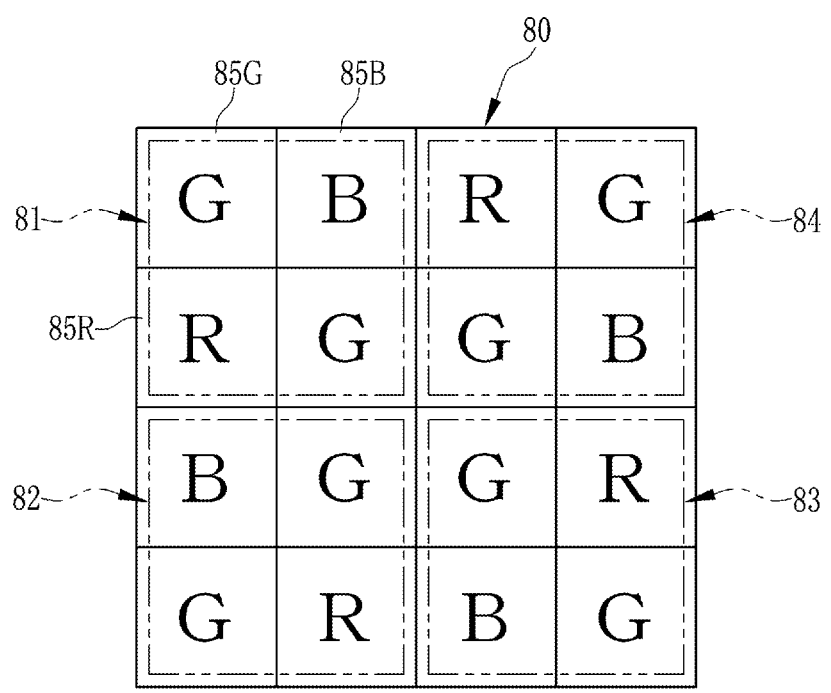
FIG. 13 is an explanatory view of an example in which a pixel group is composed of pixels of 2×2.

In the above embodiments, each pixel group is composed of nine pixels of 3×3. In a color image pickup device 80 shown in FIG. 13, each pixel group is composed of four pixels of 2×2. The color image pickup device 80 has a first pixel group 81, a second pixel group 82, a third pixel group 83, and a fourth pixel group 84, as with the above embodiments.

The first pixel group 81 is composed of four pixels of 2×2, including one red pixel 85R, two green pixels 85G, and one blue pixel 85B arranged in the Bayer pattern. In the second pixel group 82, the third pixel group 83, and the fourth pixel group 84, pixels are arranged such that the first pixel group 81 in the Bayer pattern is turned by every 90 degrees. In the color image pickup device 80, sixteen pixels of 4×4, including the first to fourth pixel groups 81 to 84, constitute a basic unit. Arranging the basic units in a lattice composes an imaging surface.

In the color image pickup device 80, as shown in the following Table 2, the ratio of vertical and horizontal lines having the green pixel is 100%, and the ratio of vertical and horizontal lines having both of the red pixel and the blue pixel is 100%. The ratio of diagonal lines having the green pixel is 75%. The ratio of diagonal lines having both of the red pixel and the blue pixel is 75%.

TABLE 2

| Name of array | Basic unit | Ratio of lines including green pixels | | Ratio of lines including both red pixels and blue pixels | | Pixel number | | | Ratio of green pixels | |
|---|---|---|---|---|---|---|---|---|---|---|
| | | Vertical and horizontal directions | Diagonal direction | Vertical and horizontal directions | Diagonal direction | R | G | B | G/R | G/B |
| Array of color image pickup device 80 | 4 × 4 | 100% | 75% | 100% | 75% | 4 | 8 | 4 | 2.0 | 2.0 |
| Bayer pattern | 2 × 2 | 100% | 50% | 0% | 50% | 1 | 2 | 1 | 2.0 | 2.0 |

As described above, according to the color image pickup device 80, the red, green, and blue pixels 85R, 85G, and 85B are included in the vertical, horizontal, and diagonal lines at a higher ratio than that in the Bayer pattern. Thus, the structure of the color image pickup device 80 in which the pixels of 4×4 are designated as the basic unit can prevent the occurrence of the pseudo color, without complicating the arithmetic process.

Also, as shown in Table 2, in the structure of the color image pickup device 80, the ratio G/R between the green pixel and the red pixel and the ratio G/B between the green pixel and the blue pixel are the same as those of the Bayer pattern. Therefore, the structure of the color image pickup device 80 eliminates the need for adjusting the sensitivity among the red, green, and blue pixels by varying the shape of the microlenses or the size of the openings in the light shielding film, as described in the above embodiments.

Eighth Embodiment

Figure 14:
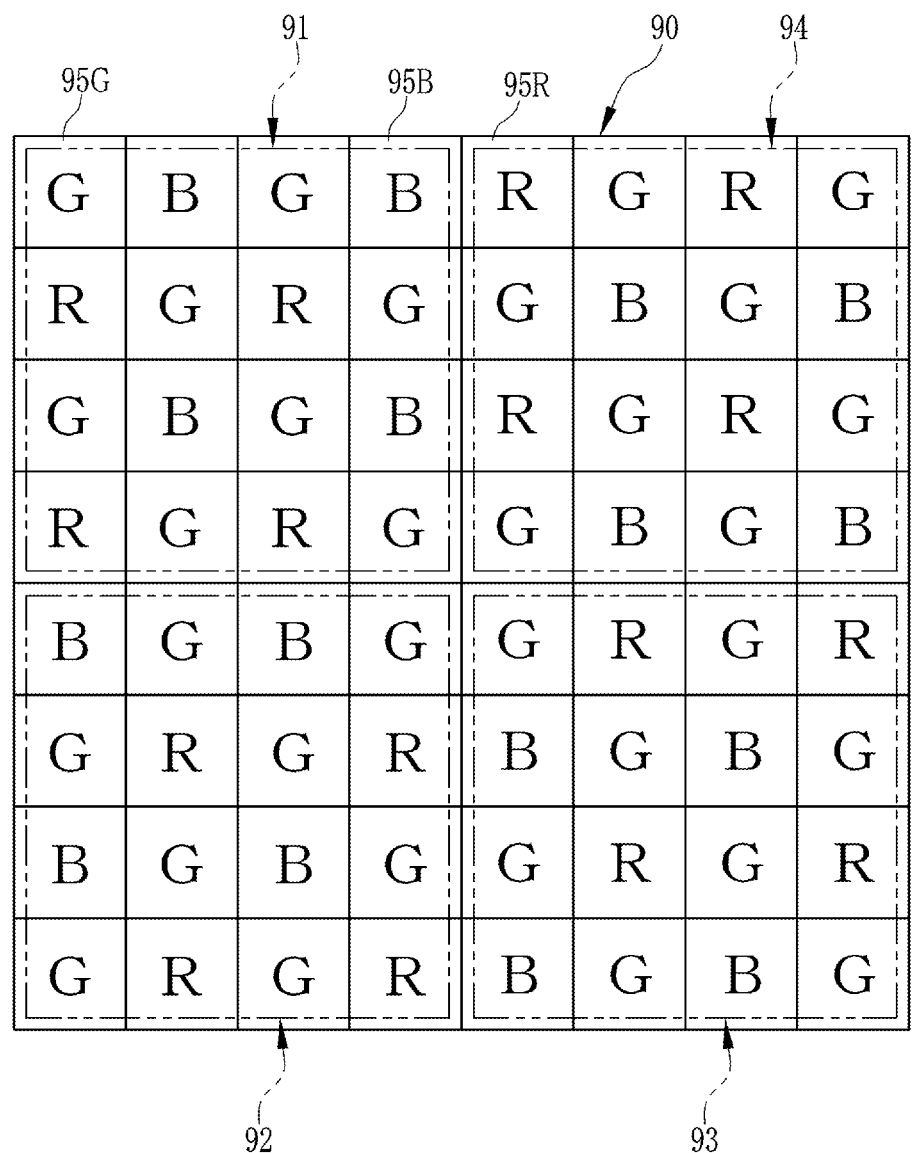
FIG. 14 is an explanatory view of an example in which a pixel group is composed of pixels of 4×4.

As shown in a color image pickup device 90 of FIG. 14, each pixel group 91, 92, 93, 94 may be composed of sixteen pixels of 4×4. The structure and arrangement method of red pixels 95R, green pixels 95G, and blue pixels 95B included in each pixel group 91, 92, 93, 94 are the same as those of the above embodiments, so the detailed description thereof will be omitted.

According to the color image pickup device 90, as shown in the following Table 3, the ratio of vertical and horizontal lines having the green pixel is 100%. The ratio of vertical and horizontal lines having both of the red pixel and the blue pixel is 100%. The ratio of diagonal lines having the green pixel is 100%. The ratio of diagonal lines having both of the red pixel and the blue pixel is 88%. Therefore, the structure of the color image pickup device 90 in which the pixels of 8×8 are designated as the basic unit can obtain the same effect as the effect of the above embodiments.

TABLE 3

| Name of array | Basic unit | Ratio of lines including green pixels | | Ratio of lines including both red pixels and blue pixels | | Pixel number | | | Ratio of green pixels | |
|---|---|---|---|---|---|---|---|---|---|---|
| | | Vertical and horizontal directions | Diagonal direction | Vertical and horizontal directions | Diagonal direction | R | G | B | G/R | G/B |
| Array of color image pickup device 90 | 8 × 8 | 100% | 100% | 100% | 88% | 16 | 32 | 16 | 2.0 | 2.0 |
| Bayer pattern | 2 × 2 | 100% | 50% | 0% | 50% | 1 | 2 | 1 | 2.0 | 2.0 |

Ninth Embodiment

Figure 15:
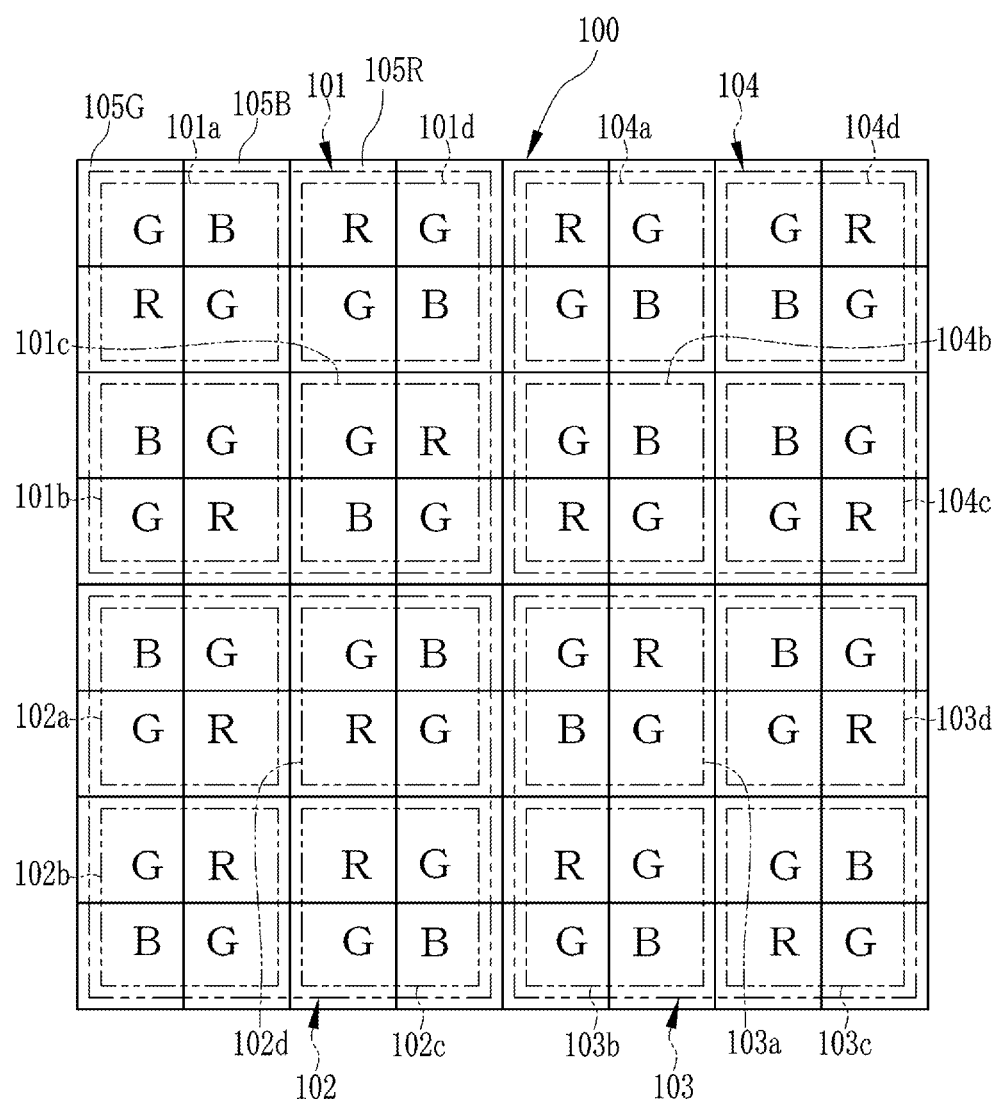
FIG. 15 is an explanatory view of an example in which a pixel group is composed of pixels of 4×4, and each pixel group is further divided into small groups each having pixels of 2×2.

In a color image pickup device 100 shown in FIG. 15, pixels (color filters) are arranged in such a pattern that an array of each pixel group 91, 92, 93, 94 composed of pixels of 4×4 of the above eighth embodiment is further turned therein on the basis of a pixel array of 2×2. The color image pickup device 100 includes first to fourth pixel groups 101, 102, 103, and 104 each of which is composed of sixteen pixels of 4×4.

The first pixel group 101 is further divided into four small groups 101a, 101b, 101c, and 101d each of which has pixels of 2×2. In the small group 101a, red pixel 105R, green pixels 105G, and blue pixel 105B are arranged in the Bayer pattern as shown in the drawing, just as with a 2×2 pixel area extracted from the first pixel group 91 of the eighth embodiment. In the small groups 101b, 101c, and 101d, the red, green, and blue pixels 105R, 105G, and 105B are arranged in such a pattern that the small group 101a is turned by every 90 degrees counterclockwise, similarly to the array patterns described in the above embodiments.

The second pixel group 102 is further divided into four small groups 102a, 102b, 102c, and 102d each of which has pixels of 2×2. In the small group 102a, the red, green, and blue pixels 105R, 105G, and 105B are arranged in the same pattern as the pattern of the second pixel group 92 of the color image pickup device 90 of the above eighth embodiment, in other words, the pattern that the Bayer pattern is turned by 90 degrees counterclockwise. In the small groups 102b, 102c, and 102d, the red, green, and blue pixels 105R, 105G, and 105B are arranged in such a pattern that the small group 102a is turned by every 90 degrees counterclockwise.

The third pixel group 103 is divided into four small groups 103a, 103b, 103c, and 103d each of which has pixels of 2×2. The fourth pixel group 104 is divided into four small groups 104a, 104b, 104c, and 104d each of which has pixels of 2×2. In each small group, the red, green, and blue pixels 105R, 105G, and 105B are arranged in the same manner as that in the first pixel group 101 and the second pixel group 102.

As shown in the following Table 4, in the color image pickup device 100 structured like this, the ratio of vertical and horizontal lines having the green pixel is 100%. The ratio of vertical and horizontal lines having both of the red pixel and the blue pixel is 100%. The ratio of diagonal lines having the green pixel is 100%. The ratio of diagonal lines having both of the red pixel and the blue pixel is 88%.

As described above, according to the structure of the color image pickup device 100, the red, green, and blue pixels 105R, 105G, and 105B are included in each of the vertical, horizontal, and diagonal lines at a higher ratio than that in the Bayer pattern. The structure of the color image pickup device 100 facilitates weakening regularity in the array pattern of the red, green, and blue pixels 105R, 105G, and 105B, and further enhancing the effect of preventing the occurrence of the pseudo color.

TABLE 4

| Name of array | Basic unit | Ratio of lines including green pixels | | Ratio of lines including both red pixels and blue pixels | | Pixel number | | | Ratio of green pixels | |
|---|---|---|---|---|---|---|---|---|---|---|
| | | Vertical and horizontal directions | Diagonal direction | Vertical and horizontal directions | Diagonal direction | R | G | B | G/R | G/B |
| Array of color image pickup device 100 | 8 × 8 | 100% | 100% | 100% | 88% | 16 | 32 | 16 | 2.0 | 2.0 |
| Bayer pattern | 2 × 2 | 100% | 50% | 0% | 50% | 1 | 2 | 1 | 2.0 | 2.0 |

Tenth Embodiment

Figure 16:
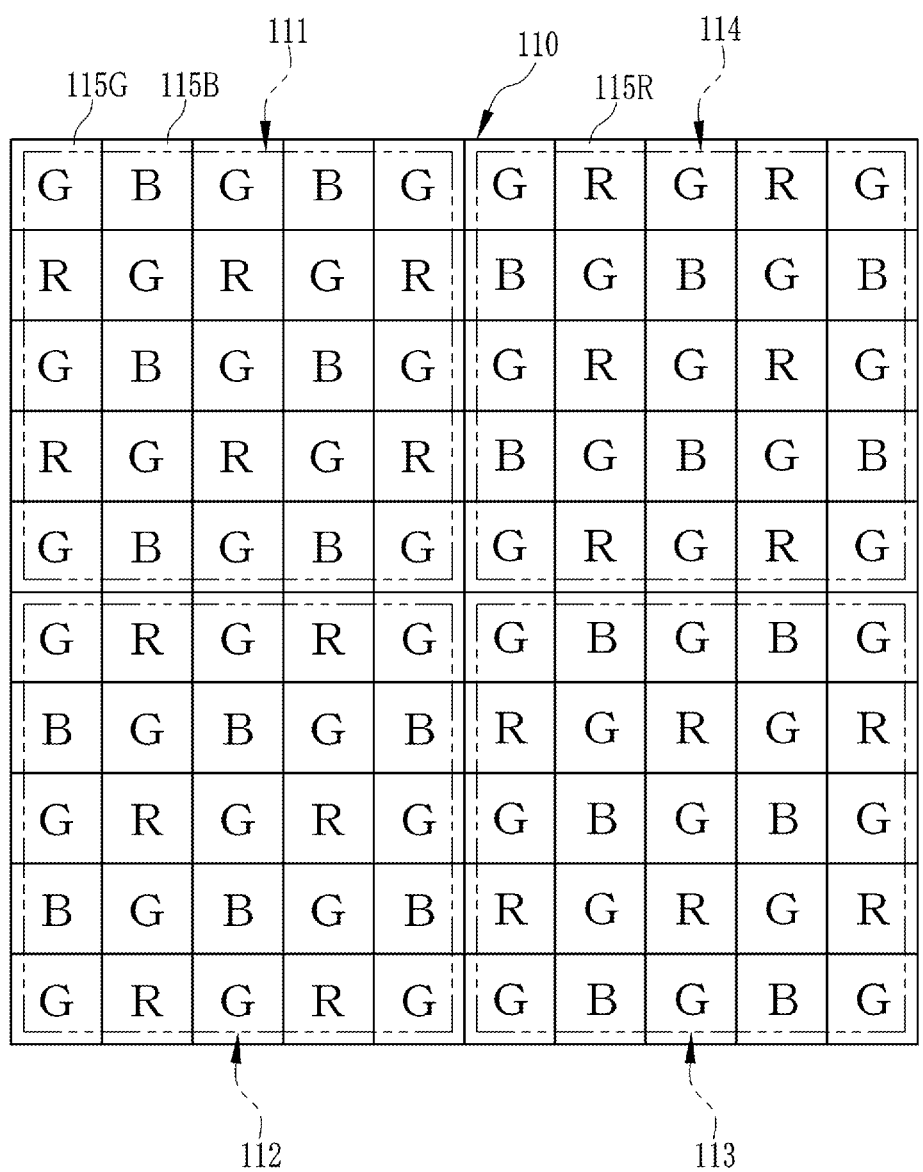
FIG. 16 is an explanatory view of an example in which a pixel group is composed of pixels of 5×5.

In a color image pickup device 110 as shown in FIG. 16, each pixel group 111, 112, 113, 114 is composed of twenty-five pixels of 5×5. The structure and arrangement method of red pixels 115R, green pixels 115G, and blue pixels 115B included in each pixel group 111, 112, 113, 114 are the same as those of the above embodiments, so the detailed description thereof will be omitted.

According to the color image pickup device 110, as shown in the following Table 5, the ratio of vertical and horizontal lines having the green pixel is 100%. The ratio of vertical and horizontal lines having both of the red pixel and the blue pixel is 100%. The ratio of diagonal lines having the green pixel is 100%. The ratio of diagonal lines having both of the red pixel and the blue pixel is 80%. Therefore, the structure of the color image pickup device 110 in which the pixels of 10×10 are designated as the basic unit can obtain the same effect as the effect of the above embodiments.

posed of twenty-five pixels of 5×5. The first pixel group 121 has four small groups 121a, 121b, 121c, and 121d each of which is composed of pixels of 2×2. These small groups 121a to 121d are disposed on the top left of the first pixel group 121. In each of the small groups 121a to 121d, red pixels 125R, green pixels 125G, and blue pixels 125B are arranged in the same pattern as the array pattern of the small groups of the above ninth embodiment. In a remaining portion of the first pixel group 121 other than the small groups 121a to 121d, the red, green, and blue pixels 125R, 125G, and 125B are arranged in the Bayer pattern, just as with the top left small group 121a.

The second pixel group 122 also has four small groups 122a, 122b, 122c, and 122d. The third pixel group 123 also has four small groups 123a, 123b, 123c, and 123d. The fourth pixel group 124 also has four small groups 124a, 124b, 124c, and 124d. The structure of each pixel group 122, 123, 124 is

TABLE 5

| Name of array | Basic unit | Ratio of lines including green pixels | | Ratio of lines including both red pixels and blue pixels | | Pixel number | | | Ratio of green pixels | |
|---|---|---|---|---|---|---|---|---|---|---|
| | | Vertical and horizontal directions | Diagonal direction | Vertical and horizontal directions | Diagonal direction | R | G | B | G/R | G/B |
| Array of color image pickup device 110 | 10 × 10 | 100% | 100% | 100% | 80% | 24 | 52 | 24 | 2.17 | 2.17 |
| Bayer pattern | 2 × 2 | 100% | 50% | 0% | 50% | 1 | 2 | 1 | 2.0 | 2.0 |

According to the color image pickup device 110, as shown in Table 5, the ratio G/R of the green pixels relative to the red pixels is 2.17. The ratio G/B of the green pixels relative to the blue pixels is 2.17. This means that the ratio of the green pixels included in the basic unit is high, as compared with the case of the Bayer pattern. Provided that each pixel group is composed of pixels of N×N, if N is an odd number, the ratio of the green pixels becomes higher than that in the Bayer pattern, as in the case of the color image pickup device 10 of the above first embodiment and the color image pickup device 110 of this embodiment. Therefore, in such a case, it is preferable to adjust the sensitivity among the red, green, and blue pixels by varying the shape of the microlenses, the size of the openings in the light shielding film, and the like.

Eleventh Embodiment

Figure 17:
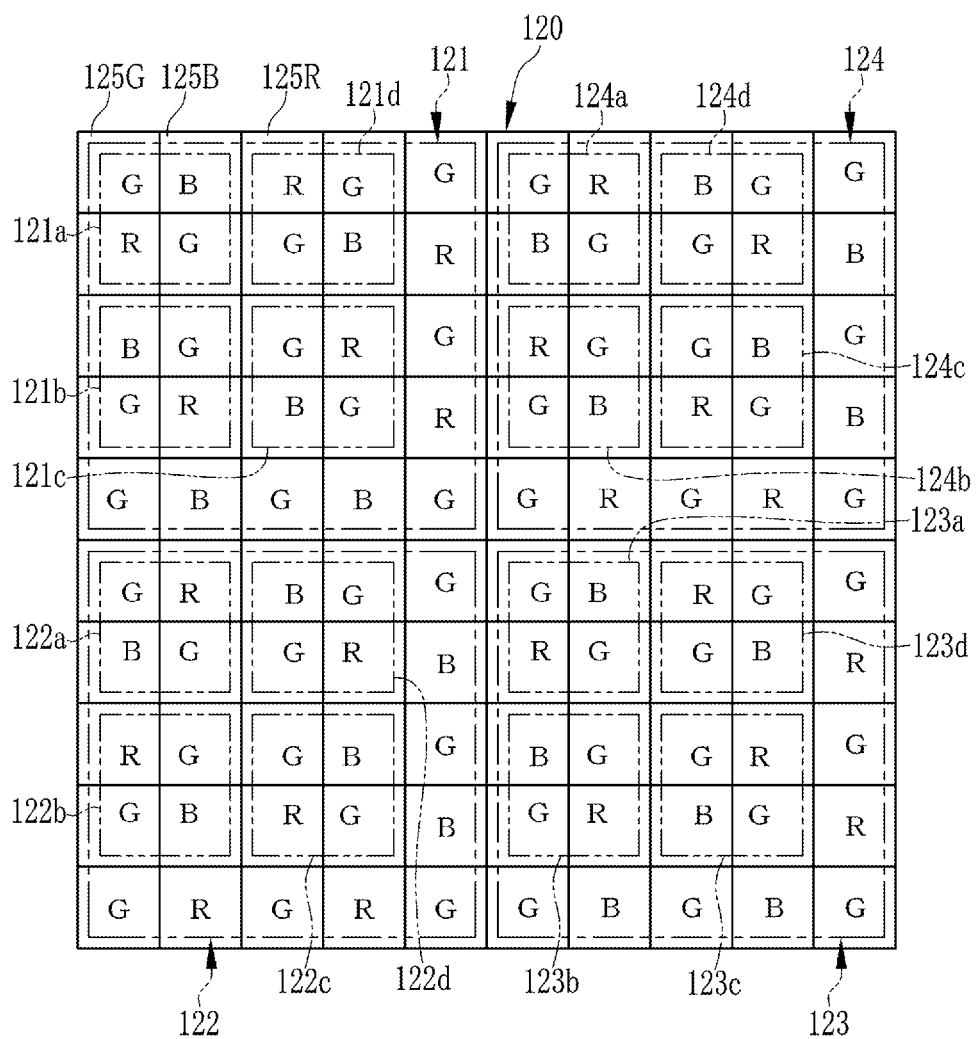
FIG. 17 is an explanatory view of an example in which a pixel group is composed of pixels of 5×5, and each pixel group is further divided into small groups each having pixels of 2×2.

Furthermore, in a color image pickup device 120 shown in FIG. 17, small groups of 2×2 may be set in each pixel group 111, 112, 113, 114 composed of pixels of 5×5 of the above tenth embodiment, and the pixels (color filters) may be arranged in such a pattern as to be turned on a small group basis.

The color image pickup device 120 includes first to fourth pixel groups 121, 122, 123, and 124 each of which is comthe same as that of the first pixel group 121, so the detailed description thereof will be omitted.

As shown in the following Table 6, in the color image pickup device 120 having the above structure, the ratio of vertical and horizontal lines having the green pixel is 100%. The ratio of vertical and horizontal lines having both of the red pixel and the blue pixel is 100%. The ratio of diagonal lines having the green pixel is 100%. The ratio of diagonal lines having both of the red pixel and the blue pixel is 80%.

As described above, according to the structure of the color image pickup device 120, the red, green, and blue pixels 125R, 125G, and 125B are included in each of the vertical, horizontal, and diagonal lines at a higher ratio than that in the Bayer pattern, and the regularity in the array pattern of the red, green, and blue pixels 125R, 125G, and 125B is appropriately weakened, so it is possible to obtain the same effect as that in the above ninth embodiment. Note that, the small groups are disposed on the top left of each of the pixel groups 121 to 124 in the above embodiment, but the position of each small group is arbitrary changeable within the pixel group.

TABLE 6

| Name of array | Basic unit | Ratio of lines including green pixels | | Ratio of lines including both red pixels and blue pixels | | Pixel number | | | Ratio of green pixels | |
|---|---|---|---|---|---|---|---|---|---|---|
| | | Vertical and horizontal directions | Diagonal direction | Vertical and horizontal directions | Diagonal direction | R | G | B | G/R | G/B |
| Array of color image pickup device 120 | 10 × 10 | 100% | 100% | 100% | 80% | 24 | 52 | 24 | 2.17 | 2.17 |
| Bayer pattern | 2 × 2 | 100% | 50% | 0% | 50% | 1 | 2 | 1 | 2.0 | 2.0 |

In the above embodiments, "N" that defines the pixel number N×N of the pixel group is 2, 3, 4, or 5, by way of example, but N may be 6 or more. In the above embodiments, the cases of "N=4 and M=2" (ninth embodiment) and "N=5 and M=2" (eleventh embodiment) are described as embodiments of a case where N≥2M holds true, but N and M can take arbitrary integers of 2 or more, such as N of 6 and M of 3, for example. However, if N and M are too large, the arithmetic process becomes complicated, so N is preferably set at the order of 5.

In the above embodiments, the first pixel group is turned by every 90 degrees counterclockwise to compose the second to fourth pixel groups. However, the first pixel group may be turned by every 90 degrees clockwise to compose the second to fourth pixel groups.

Figure 18:
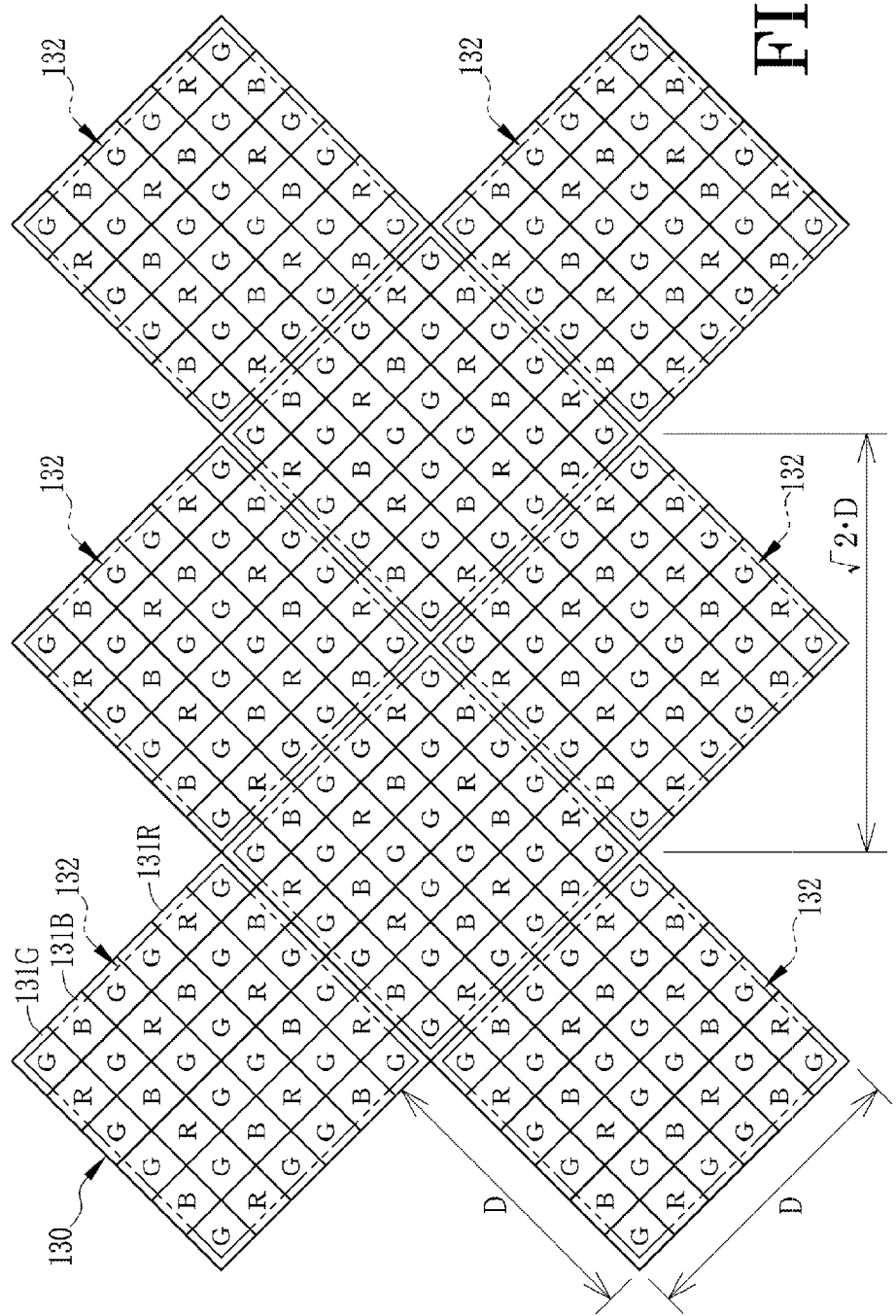
FIG. 18 is an explanatory view of an example in which an imaging surface is composed of an array of square pixels that are turned by 45 degrees and arranged in a diagonal direction of 45 degrees.

Moreover, the present invention is also applicable to a color image pickup device 130 of FIG. 18, in addition to the color image pickup device of the square lattice structure as described above. This color image pickup device 130 has a so-called honeycomb structure in which red, green, and blue pixels 131R, 131G, and 131B are formed in rhombuses by turning a square by approximately 45 degrees with respect to horizontal and vertical directions of an approximately rectangular imaging surface, and the red, green, and blue pixels 131R, 131G, and 131B are arranged in a diagonal direction of 45 degrees.

In the color image pickup device 130, the red, green, and blue pixels 131R, 131G and 131B are arranged in an array that a basic unit array of 6×6 of the above first embodiment is turned by 45 degrees clockwise, to compose a rhombus-shaped basic unit pixel group 132 having a side of D. Then, arranging a plurality of rhombus-shaped basic unit pixel groups 132 in the diagonal direction of 45 degrees forms the approximately rectangular imaging surface. Note that, this structure can also be defined as superposition of a pixel group that includes the basic unit pixel groups 132 arranged in the horizontal and vertical directions at an arrangement pitch of $\sqrt{2} \cdot D$ and another pixel group that the aforementioned pixel group is shifted by D in the diagonal direction of 45 degrees. The color image pickup device 130 of the honeycomb structure as described above can have the same effect as that in the above embodiments.

Although the present invention has been fully described by the way of the preferred embodiment thereof with reference to the accompanying drawings, various changes and modifications will be apparent to those having skill in this field. Therefore, unless otherwise these changes and modifications depart from the scope of the present invention, they should be construed as included therein.

What is claimed is:

1. A color image pickup device having an imaging surface having an array of pixels, each of said pixels having one of a red color filter for transmitting red light, a green color filter for transmitting green light, and a blue color filter for transmitting blue light, said color image pickup device comprising:
   a plurality of first pixel groups each including an array of said pixels of N×N, in taking N as an integer of 3 or more, having said red, green, and blue color filters arranged in a predetermined pattern;
   a plurality of second pixel groups disposed in said imaging surface such that each of said second pixel groups is adjacent to bottom of said first pixel group, said second pixel group including an array of said pixels having said red, green, and blue color filters arranged in such a pattern that said pattern of said first pixel group is turned by 90 degrees in one direction;
   a plurality of third pixel groups disposed in said imaging surface such that each of said third pixel groups is adjacent to right of said second pixel group, said third pixel group including an array of said pixels having said red, green, and blue color filters arranged in such a pattern that said pattern of said first pixel group is turned by 180 degrees in said one direction; and
   a plurality of fourth pixel groups disposed in said imaging surface such that each of said fourth pixel groups is adjacent to top of said third pixel group, said fourth pixel group including an array of said pixels having said red, green, and blue color filters arranged in such a pattern that said pattern of said first pixel group is turned by 270 degrees in said one direction, wherein
   a ratio in number among said red, green, and blue color filters on a color-by-color basis is different between a pixel area of 2N×2N composed of said first to fourth pixel groups adjoining one another and another pixel area of 2N×2N in a Bayer pattern, and
   said pixel having said color filter whose ratio in number is lower than said ratio in number in said Bayer pattern is more sensitive than said pixel having said color filter whose ratio in number is higher than said ratio in number in said Bayer pattern.

2. The color image pickup device according to claim 1, wherein
   each of said pixels includes a photoelectric conversion element and a microlens, wherein
   said photoelectric conversion element converts incident light into electric charge and accumulates said electric charge; and said microlens is formed in a convex curved shape on a light incidence surface side, and gathers said light to said photoelectric conversion element.

3. The color image pickup device according to claim 2, wherein
said microlens is substantially in shape of a square with a rounded corner in a plane, and is of size within an arrangement pitch of said pixels; and
said pixel having said color filter whose ratio in number is low has said microlens having said corner having a shorter radius of curvature than a radius of curvature of said corner of said microlens that said pixel having said color filter whose ratio in number is high has.

4. The color image pickup device according to claim 2, wherein
said microlens is formed substantially in shape of a circle whose diameter is within an arrangement pitch of said pixels in a plane; and
said pixel having said color filter whose ratio in number is low has said microlens having said larger diameter than said diameter of said microlens that said pixel having said color filter whose ratio in number is high has.

5. The color image pickup device according to claim 3, wherein said microlens is formed by melting a photoresist formed in a prismatic or cylindrical shape by heat treatment.

6. The color image pickup device according to claim 2, wherein
said microlens of said pixel having said color filter whose ratio in number is high is formed substantially in shape of a circle having a diameter smaller than an arrangement pitch of said pixels in a plane; and
said microlens of said pixel having said color filter whose ratio in number is low is in such a shape in a plane that a substantial circle having a diameter larger than said arrangement pitch of said pixels is partly cut out along a border between said pixels.

7. The color image pickup device according to claim 6, wherein said microlens is formed by using a gradation mask having a gradient of optical density in a pattern in accordance with the shape of each of said microlenses.

8. The color image pickup device according to claim 2, wherein
said microlens of said pixel having said color filter whose ratio in number is high is formed substantially in shape of a circle in a plane; and
said microlens of said pixel having said color filter whose ratio in number is low is substantially in shape of a square with a rounded corner in a plane, and said square is larger than said circle in size.

9. The color image pickup device according to claim 1, wherein an opening of a light shielding film of said pixel having said color filter whose ratio in number is low is larger in size than an opening of said light shielding film of said pixel having said color filter whose ratio in number is high.

10. The color image pickup device according to claim 1, wherein provided that N≥2M in taking M as an integer of 2 or more, said array of said pixels of N×N is divided into four small groups each having an array of said pixels of M×M, an array pattern of said red, green, and blue color filters of said pixels of M×M is turned by every 90 degrees in one direction in said four small groups, just as with said patterns of said first to fourth pixel groups.

11. The color image pickup device according to claim 1, wherein
said imaging surface is formed substantially in shape of a rectangle; and
each of said pixels is formed in shape of a rhombus into which a square is turned by substantially 45 degrees with respect to a horizontal direction and a vertical direction of said imaging surface, and said pixels are arranged in a diagonal direction of 45 degrees.

12. The color image pickup device according to claim 1, wherein
said N is "3";
said pixel area of 2N×2N includes said red, green, and blue color filters of said pixels at a ratio of eight red color filters, twenty green color filters, and eight blue color filters; and
a ratio in number between said red color filters and said green color filters is "2.5", and a ratio in number between said blue color filters and said green color filters is "2.5".

13. The color image pickup device according to claim 1, wherein
said N is "5";
said pixel area of 2N×2N includes said red, green, and blue color filters of said pixels at a ratio of twenty-four red color filters, fifty-two green color filters, and twenty-four blue color filters; and
a ratio in number between said red color filters and said green color filters is "2.17", and a ratio in number between said blue color filters and said green color filters is "2.17".

* * * * *